United States Patent
Sparrowe et al.

(10) Patent No.: US 11,552,266 B2
(45) Date of Patent: Jan. 10, 2023

(54) ELECTRODES FOR ELECTRONIC DEVICES COMPRISING AN ORGANIC SEMICONDUCTING LAYER

(71) Applicant: FLEXENABLE LIMITED, Cambridge (GB)

(72) Inventors: David Sparrowe, Bournemouth (GB); Pawel Miskiewicz, Neu-Isenburg (DE); Mark James, Romsey (GB)

(73) Assignee: FLEXENABLE LIMITED, Cambridge (GB)

( * ) Notice: Subject to any disclaimer, the term of this patent is extended or adjusted under 35 U.S.C. 154(b) by 0 days.

(21) Appl. No.: 16/647,168

(22) PCT Filed: Sep. 11, 2018

(86) PCT No.: PCT/EP2018/074378
§ 371 (c)(1),
(2) Date: Mar. 13, 2020

(87) PCT Pub. No.: WO2019/052978
PCT Pub. Date: Mar. 21, 2019

(65) Prior Publication Data
US 2020/0274086 A1   Aug. 27, 2020

(30) Foreign Application Priority Data
Sep. 13, 2017   (EP) ..................... 17190868

(51) Int. Cl.
*H01L 51/10*   (2006.01)
*H01L 51/00*   (2006.01)
*H01L 51/05*   (2006.01)

(52) U.S. Cl.
CPC ........ *H01L 51/105* (2013.01); *H01L 51/0003* (2013.01); *H01L 51/0021* (2013.01); *H01L 51/055* (2013.01); *H01L 51/0541* (2013.01); *H01L 51/0545* (2013.01); *H01L 51/0566* (2013.01); *H01L 51/107* (2013.01); *H01L 2251/301* (2013.01)

(58) Field of Classification Search
CPC .. H01L 51/105; H01L 51/0021; H01L 51/055
See application file for complete search history.

(56) References Cited

U.S. PATENT DOCUMENTS

| 2015/0162385 A1 | 6/2015 | Dittmar et al. |
| 2015/0188053 A1 | 7/2015 | Newsome |
| 2017/0062744 A1 | 3/2017 | Jesper et al. |

FOREIGN PATENT DOCUMENTS

| WO | 2013190255 A2 | 12/2013 |
| WO | 2015124284 A1 | 8/2015 |

OTHER PUBLICATIONS

International Search Report for PCT/EP2018/074378 dated Dec. 11, 2018.
International Preliminary Report on Patentability for PCT Application No. PCT/EP2018/074378 dated Mar. 17, 2020 (pp. 1-6).

*Primary Examiner* — Anthony Ho
(74) *Attorney, Agent, or Firm* — Millen, White, Zelano & Branig; Ryan Pool

(57) ABSTRACT

The present application relates to an organic electronic device, said electronic device comprising a multi-layer electrode as well as an organic semiconducting layer, as well as to a method for producing such organic electronic device.

15 Claims, 1 Drawing Sheet

ELECTRODES FOR ELECTRONIC DEVICES COMPRISING AN ORGANIC SEMICONDUCTING LAYER

TECHNICAL FIELD

The present application relates to an organic electronic device, said electronic device comprising a multi-layer electrode as well as an organic semiconducting (OSC) layer, as well as to a method for producing such organic electronic device.

BACKGROUND

Organic electronic materials have established their presence in a wide range of electronic devices, such as organic photodetectors (OPDs), organic photovoltaic cells (OPV), organic light emitting diodes (LEDs) and organic field effect transistors (OFETs), to name a few only. Because they may be deposited onto an underlying substrate by solution processing, organic electronic materials hold the promise of allowing for simplified and highly flexible production, potentially also leading to reduced manufacturing costs.

In order to obtain an efficient organic electronic device the work function of the electrode materials has to match the energy level of the highest occupied molecular orbital (HOMO) for a p-type organic semiconducting material and of the lowest unoccupied molecular orbital (LUMO) for an n-type organic semiconducting material. Therefore, for a p-type organic electronic device gold, palladium and platinum are suitable electrode materials. Alternatively silver electrodes have been used in combination with self-assembled monolayers, wherein the self-assembled monolayer brings the work function of the electrode to a level suitable for a p-type organic electronic device.

An overview of the work function of the chemical elements is given in Herbert B. Michaelson, Journal of Applied Physics 48, 4729 (1977); doi: 10.1063/1.323539.

However, all of these noble metal electrodes add significant cost to the organic electronic device and there is therefore an interest to be able to use lower-cost metals as electrode materials.

Copper may, for example, be considered as a possible alternative electrode material because of its good conductivity, relatively low cost and relative ease to use in manufacturing processes. In addition, copper is already used in the semiconductor industry.

However, copper is characterized by relatively high chemical reactivity and requires surface modification so as to match the work function of the copper electrode to the respective organic semiconducting material. Such surface modification may, for example, be done by plating the copper surface with silver. This, however, frequently leads to the formation of silver dendrites, consequently rendering the so-produced electronic devices useless.

There is therefore a need in the industry to overcome the drawbacks of these electrodes.

Consequently, it is an object of the present application to provide for an electrode of reduced cost suitable for use in an organic electronic device.

It is also an object to provide for an electrode the work function of which can be adapted to the respective organic semiconducting materials used in the organic electronic device.

Further it is an object to provide for an electrode that can be easily and/or reliably manufactured, preferably on commercial production scale.

Furthermore, it is an object to provide for an organic electronic device having good, preferably improved, performance.

Additionally, it is an object of the present application to provide for a production process for such electrode and such organic electronic device.

SUMMARY

The present inventors have now surprisingly found that the above objects may be attained either individually or in any combination by the present organic electronic devices and by the production method disclosed in the present application.

The present application therefore provides for an organic electronic device comprising
- one or more electrodes comprising a first electrode layer and a second electrode layer essentially covering the first electrode layer; and
- an organic semiconducting layer, wherein said first electrode layer comprises a first metal, said first metal being selected from the group consisting of chromium, molybdenum, tungsten and any blend of any of these; and wherein said second electrode layer comprises a second metal, said second metal being selected from the group consisting of any metal or blend of metals suitable for electroless plating of the first electrode layer.

The present application therefore also provides for a method of producing such organic electronic device, said method comprising the steps of
(a) providing one or more first electrode layer as defined herein, optionally on a substrate as defined herein;
(b) depositing onto said first electrode layer a second electrode layer as defined herein, to obtain one or more electrode; and
(c) depositing onto said electrode an organic semiconducting material to obtain an organic semiconducting layer.

DETAILED DESCRIPTION

Figure 1:
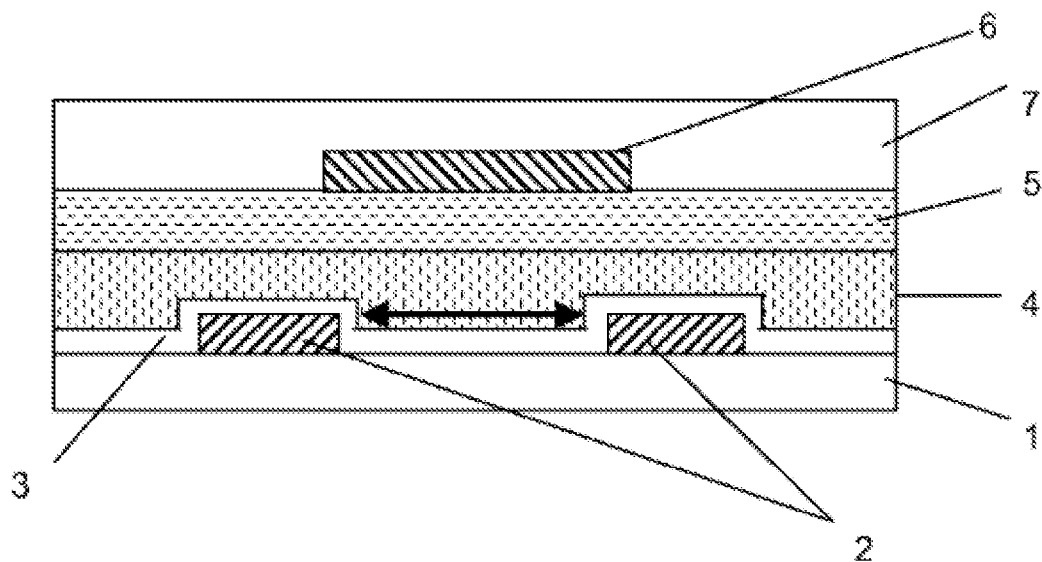
FIG. 1 shows a schematic representation of an exemplary top gate OFET in accordance with the present application.

As used herein, the symbol "*" denotes a linkage to an adjacent unit or group (for example, in case of a polymer, to an adjacent repeating unit or any other group) or surface, including a linkage to a metal atom comprised in a metal layer, such as an electrode layer. Alternatively, when specifically mentioned and with regards to specific formulae, "*" may also denote a specific group or atom, for example H. As used herein, the term "organic electronic device" refers to an electronic device comprising an organic semiconducting layer, i.e. a semiconducting layer comprising at least 50 wt % (e.g. 60 wt % or 70 wt % or 80 wt % or 90 wt % or 95 wt % or 97 wt % or 99.0 wt % or 99.5 wt % or 99.7 wt % or 99.9 wt %), with wt % relative to the total weight of said semiconducting layer, and preferably consists of one or more organic semiconducting material.

As used herein, the terms "consist of" and "consisting of" do not exclude the presence of impurities, which may normally be present, for example but in no way limited to, impurities resulting from the synthesis of a compound (e.g. an organic semiconducting material) or—in case of metals—trace metals.

As used herein, the term "organyl group" is used to denote any organic substituent group, regardless of functional type, having one free valence at a carbon atom (see also International Union of Pure and Applied Chemistry, Compendium of Chemical Terminology, Gold Book, Version 2.3.3, 2014 Feb. 4, page 1040).

As used herein, the term "organoheteryl group" is used to denote any univalent or polyvalent group comprising carbon, which are thus organic, but which have their free valence at an atom other than carbon (see also International Union of Pure and Applied Chemistry, Compendium of Chemical Technology, Gold Book, Version 2.3.2, 2012 Aug. 9, page 1038).

For the purposes of the present application the term "carbyl group" includes both, organyl groups and organoheteryl groups.

As used herein, the term "hydrocarbyl group" is used to denote a univalent group formed by removing a hydrogen atom from a hydrocarbon (see also International Union of Pure and Applied Chemistry, Compendium of Chemical Terminology, Gold Book, Version 2.3.3, 2014 Feb. 4, pages 694-695).

As used herein, the term "hetero atom" will be understood to mean an atom in an organic compound that is not a H- or C-atom, and preferably will be understood to mean N, O, S, P, Si, Se, As, Te or Ge, unless specified otherwise.

In general terms the present application relates to an organic electronic device comprising one or more electrodes and an organic semiconducting layer. Said one or more electrodes comprise a first electrode layer and a second electrode layer.

The first electrode layer comprises a first metal, preferably in at least 50 wt % (for example in at least 60 wt % or 70 wt % or 80 wt % or 90 wt % or 95 wt % or 97 wt % or 99.0 wt % or 99.5 wt % or 99.7 wt % or 99 wt %), with wt % relative to the total weight of said first electrode layer, and most preferably consists of the first metal. The first metal is selected from the group consisting of chromium, molybdenum, tungsten, and any blend thereof. Preferably said first metal is molybdenum.

In case the first electrode layer does not consist of the first metal, further first metals or metal oxides may be present so as to make up the difference to 100 wt %. Preferably said further first metal may be selected from metals with a work function higher than or comparable to that of the first metal. Suitable further first metals may be selected from the group consisting of cobalt, rhodium, iridium, nickel, palladium, platinum, gold, silver, and any blend of any of these. An example of a suitable metal oxide is ITO (indium tin oxide).

The second electrode layer essentially covers the first electrode layer. In this context the term "essentially covers" is used to denote that—depending upon the architecture of the respective organic electronic device—the second electrode layer covers the first electrode layer in such a way that no part or at least only a minor part (for example, at most 20% or 10% or 5% by surface) of the first electrode is in direct physical contact with the organic semiconducting layer.

The second electrode layer comprises a second metal in at least 50 wt % (for example in at least 60 wt % or 70 wt % or 80 wt % or 90 wt % or 95 wt % or 97 wt % or 99.0 wt % or 99.5 wt % or 99.7 wt % or 99 wt %), with wt % relative to the total weight of said second electrode layer, and preferably consists of the second metal. Said second metal is selected from the group consisting of metals suitable for electroless plating of the first electrode layer. Generally stated, such metals suitable for electroless plating of the first electrode layer are those metals that are higher up in the electrochemical series of the elements, i.e. are more "noble". Preferably, such metals may be selected from the group consisting of silver, metals having a work function φ of at least 4.9 eV (more preferably of at least 5.0 eV, and most preferably of at least 5.1 eV), and any blend of any of these. Preferably said second metal is silver.

Examples of suitable metals having a work function φ of at least 4.9 eV may be selected from the group consisting of cobalt ($\phi_{Co}$=5.0 eV), rhodium ($\phi_{Rh}$=4.98 eV), iridium ($\phi_{Ir}$=5.27 eV), nickel ($\phi_{Ni}$=5.15 eV), palladium ($\phi_{Pd}$=5.12 eV), platinum ($\phi_{Pt}$=5.65 eV), gold ($\phi_{Au}$=5.1 eV), and any blend of any of these; and preferably may be selected from the group consisting of cobalt, iridium, nickel, palladium, platinum, gold, and any blend of any of these; and more preferably may be selected from the group consisting of iridium, nickel, palladium, platinum, gold, and any blend of any of these; and most preferably may be selected from the group consisting of palladium, platinum, gold, and any blend of any of these. The respective work functions φ have been taken from Herbert B. Michaelson, Journal of Applied Physics 48, 4729 (1977); doi: 10.1063/1.323539.

Preferably, and particularly if the second electrode layer comprises or consists of silver, the one or more electrodes comprise a third electrode layer covering the second electrode layer.

Preferably, the third electrode layer has a thickness of at least 0.3 molecular layers to 10 nm.

The third electrode layer—if present—is a self-assembled monolayer. Preferably the self-assembled monolayer consists of moieties selected from the group consisting of the following moieties of formulae (I) to (III)

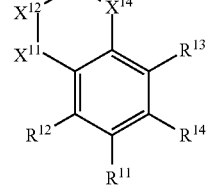

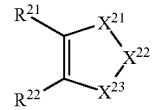

with $X^1$, $X^{11}$, $X^{12}$, $X^{13}$, $X^{14}$, $X^{21}$, $X^{22}$, $X^{23}$, $R^1$, $R^{11}$, $R^{12}$, $R^{13}$, $R^{14}$, $R^{21}$, $R^{22}$, Sp and a as defined herein.

Preferably the self-assembled monolayers of the present invention may have a thickness (measured perpendicular to the surface of such layer) from 1 to 10, more preferably from 1 to 5, even more preferably from 1 to 3, and still even more preferably from 1 to 2 molecular layers. Most preferably said thickness is one molecular layer.

(SAM-1)

$X^1$ is at each occurrence independently selected from the group consisting of —$X^a$—, —$X^a$—$X^b$—, —C(=$X^a$)—

$X^b$—, —$X^aO_3$—, —$X^a$—$X^bO_3$—, —$PO_2H$—, and —$PO_3H$—. Preferably $X^1$ is at each occurrence —$X^a$—.

$X^a$ and $X^b$ are at each occurrence independently S or Se. Preferably, $X^a$ and $X^b$ are S.

It is noted that with regards to functional group $X^1$ selected from the group consisting of —$XaO_3$—, —$X^a$—$X^bO_3$—, —$PO_2H$— and —$PO_3H$— a number of possible binding modes between $X^1$ and the metal surface may be envisaged. Without wishing to be bound by theory it is believed that generally the bonding between these functional groups $X^1$ and the metal or metal oxide surface is done by means of —O—. An example of such bonding is Metal-O—P—. These functional groups $X^1$ may for example be bound to the metal surface by means of one or more groups —O—. It is also possible that more than one such binding modes exist simultaneously.

a is 0 or 1. For a being 0, formula (I) can be simplified to $R^1$—$X^1$—*.

Sp is at each occurrence independently a group of formula (IV)

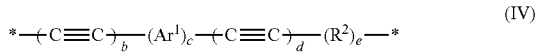

with b, c, d, e, $Ar^1$ and $R^2$ as defined herein.

b, c, d and e are at each occurrence independently 0, 1 or 2, with the provision that if a is 1, then the sum of b, c, d and e is at least 1, i.e. b+c+d+e≥1.

Preferred combinations of b, c, d and e may be selected from the following:
(i) b+d is 1; preferably b is 1 and d is 0.
(ii) b, c and e are all 1; and d is 0.
(iii) e is 1; and b, c and d are all 0.
(iv) b, c, d and e are all 1.
(v) c and e are all 1; and b and d are all 0.
(vi) c is 1; and b, d and e are all 0.

$Ar^1$ is para-phenylene, or para-phenylene wherein one or more carbon ring atom is substituted by N. Examples of suitable $Ar^1$ may be selected from the group consisting of the following

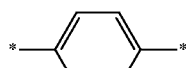 (IV-1)

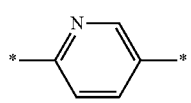 (IV-2)

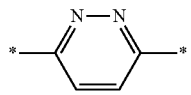 (IV-3)

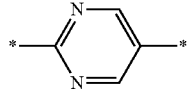 (IV-4)

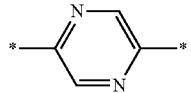 (IV-5)

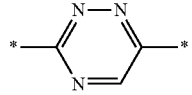 (IV-6)

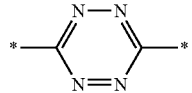 (IV-7)

which may be used in either direction, i.e. with either * in the direction of the functional group $X^1$ of the moiety of formula (I). Of the above para-phenylene (IV-1) is preferred. Optionally, one or more of the hydrogen present on $Ar^1$ may be replaced by fluorine.

$R^2$ is at each occurrence independently selected from the group consisting of —$CH_2$—, —CHF—, and —$CF_2$—.

$R^1$ is at each occurrence independently an organyl group or an organoheteryl group. Preferably $R^1$ may at each occurrence independently be selected from the group consisting of aryl, alkyl having from 1 to 20 (preferably from 1 to 15, more preferably from 1 to 10) carbon atoms, aryl substituted with one or more groups $R^A$, and alkyl having from 1 to 20 (preferably from 1 to 15, more preferably from 1 to 10) carbon atoms substituted with one or more groups $R^A$, with $R^A$ as defined herein.

$R^A$ is an electron withdrawing group. Preferably $R^A$ is at each occurrence independently selected from the group consisting of —$NO_2$, —CN, —F, —Cl, —Br, —I, —$OAr^2$, —$OR^3$, —$COR^3$, —SH, —$SR^3$, —OH, —C—$CR^3$, —CH=$CR^{32}$, and alkyl having from 1 to 10 carbon atoms, wherein one or more, preferably all, hydrogen atoms are replaced by F, with $Ar^2$ and $R^3$ as defined herein. More preferably $R^A$ is at each occurrence independently selected from the group consisting of —CN, —F, —Cl, —Br, —I, —$OR^3$, and alkyl having from 1 to 10 carbon atoms, wherein one or more, preferably all, hydrogen atoms are replaced by F, with $R^3$ as defined herein. Even more preferably $R^A$ is at each occurrence independently selected from the group consisting of —F, —$OR^3$, and alkyl having from 1 to 10 carbon atoms, wherein one or more, preferably all, hydrogen atoms are replaced by F, with $R^3$ as defined herein. $Ar^2$ is an aryl having from 6 to 30 carbon atoms, preferably having from 6 to 20 carbon atoms, and most preferably is phenyl. Preferably $Ar^2$ is substituted with one or more substituent selected from the group consisting of —CN, —F, —Cl, —Br, —I, —$OR^3$, and alkyl having from 1 to 10, preferably from 1 to 5, carbon atoms, wherein one or more, preferably all, hydrogen atoms are replaced by F, with $R^3$ as defined herein.

$R^3$ is an alkyl having from 1 to 10, preferably from 1 to 5, carbon atoms, or alkyl having from 1 to 10, preferably from 1 to 5, carbon atoms, wherein one or more, preferably all, hydrogen atoms are replaced by F.

Preferred examples of alkyl suitable as $R^3$ may be selected from the group consisting of methyl, ethyl, n-propyl, iso-propyl, n-butyl, iso-butyl, tert-butyl and n-pentyl. Preferred examples of fluorinated alkyl (i.e. alkyl wherein one or more, preferably all, hydrogen atoms are replaced by F) suitable as $R^3$ may be selected from the group consisting of $CF_3$, $C_2F_5$, n-$C_3F_7$, and n-$C_4F_9$.

Suitable examples of $R^1$ may be selected from the group consisting of the following formulae (V-1) to (V-16)

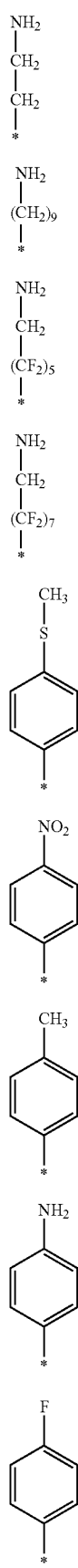
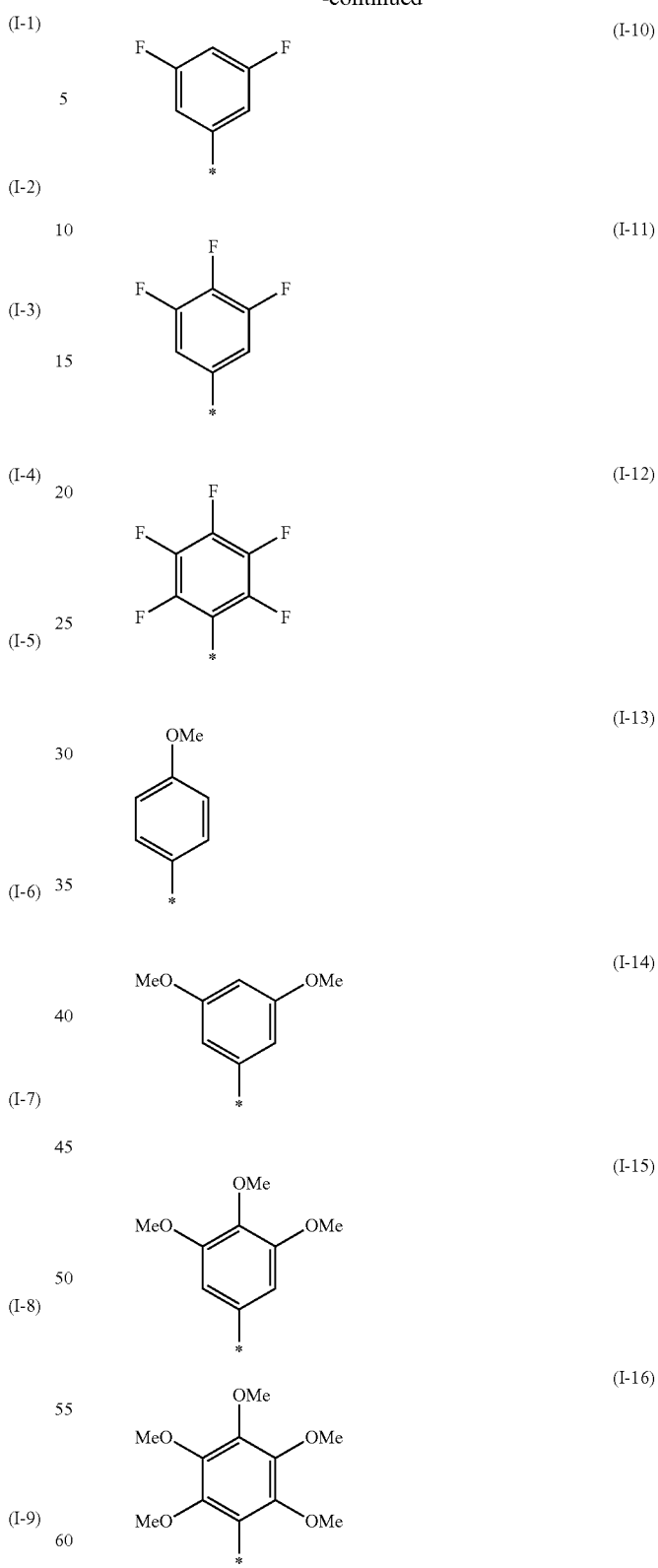
with (I-9) to (I-16) being preferred, and (I-12) and (I-15) being particularly preferred.
Suitable groups moieties of $R^1$ may be selected from the following formulae (I-17) to (I-11)

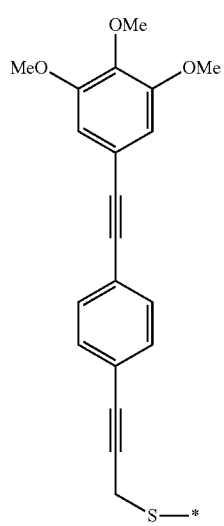 (I-17)
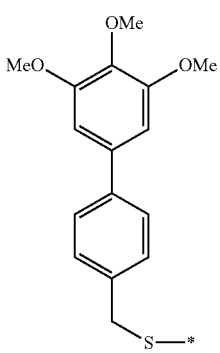 (I-20)
(I-18)
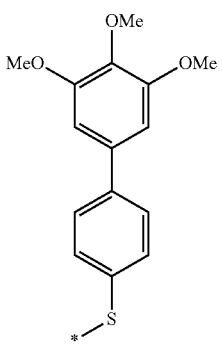 (I-21)
(I-19)
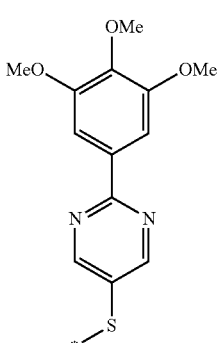 (I-22)
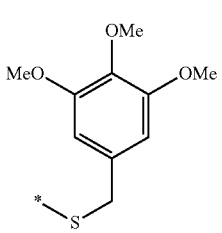 (I-23)

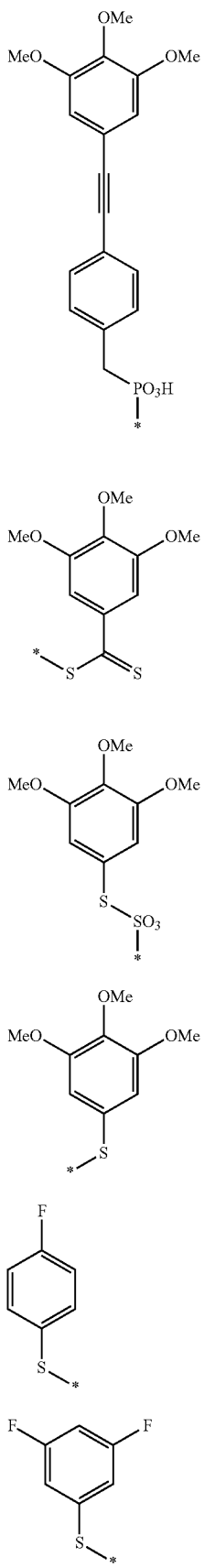
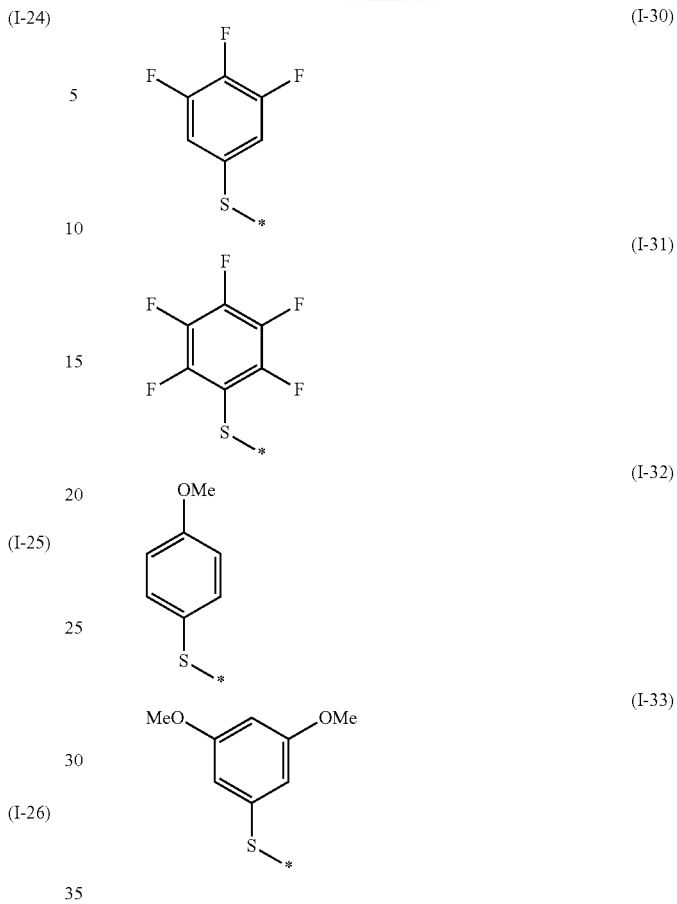

with moieties (I-27) to (I-33) being preferred.

(SAM-2)

$X^{11}$ is selected from the group consisting of —$CH_2$—, —$CF_2$— and aromatic C—$R^{15}$, with $R^{15}$ as defined below.

$X^{12}$ is selected from the group consisting of —$CH_2$—, —$CF_2$— and —C(=O)—.

$X^{13}$ is selected from the group consisting of —$CH_2$—, —$CF_2$— and N—$R^{16}$, with $R^{16}$ as defined below.

$X^{14}$ is selected from the group consisting of —$CH_2$—, —$CF_2$—, —C(=O)— and N—$R^{17}$, with $R^{17}$ as defined below.

$X^{11}$, $X^{12}$, $X^{13}$ and $X^{14}$ may be selected independently of each other, provided that either $X^{13}$ is N—$R^{16}$ or $X^{14}$ is N—$R^{17}$.

It is preferred that $X^{11}$ is C—$R^{15}$, $X^{12}$ is —C(=O)—, $X^{13}$ is N—$R^{16}$ and $X^{14}$ is —C(=O)— or that $X^{11}$ is —$CH_2$—, $X^{12}$ is —$CH_2$—, $X^{13}$ is —$CH_2$— and $X^{14}$ is $NR^{17}$, with $R^{15}$, $R^{16}$ and $R^{17}$ as defined below.

$R^{11}$ and—if present—$R^{16}$ are independently of each other selected from the group consisting of H, F, methyl, ethyl, methyl wherein one or more hydrogen is replaced by fluorine, ethyl wherein one or more hydrogen is replaced by fluorine, and Sp as defined above, provided that at least one of $R^{11}$ and $R^{16}$ is -(Sp)$_a$-$X^1$—*, and provided that if $X^{13}$ is N—$R^{15}$, then $R^{11}$ and $R^{16}$ are not both -(Sp)$_a$-$X^1$—*.

$R^{12}$, $R^{13}$, $R^{14}$, $R^{15}$ and $R^{17}$ are independently of each other selected from the group consisting of H, F, methyl, ethyl, methyl wherein one or more hydrogen is replaced by fluorine, ethyl wherein one or more hydrogen is replaced by fluorine, and two or three neighboring groups of $R^{12}$, $R^{13}$, $R^{14}$, $R^{15}$ and $R^{17}$ may together form an aliphatic or aromatic ring system having a total of from 6 to 24 aromatic ring atoms. Exemplary aliphatic ring systems may be selected from the group consisting of cyclopentane, cyclohexane, cycloheptane, cyclopoctane, cyclononane, and cyclodecane. Cyclopentane and cyclohexane are preferred examples of aliphatic ring systems. Exemplary aromatic ring systems may be selected from the group consisting of benzene, pyridine, pyridazine, pyrimidine, pyrazine, 1,2,3-triazine, 1,2,4-triazine, napthalene, quinoline, isoquinoline, cinnoline, quinazoline, quinoxaline, phthalazine, 1,2,3-triazine, 1,2,4-triazine, anthracene, phenantrene, acridine, phenanthridine, and phenazine. Benzene and pyridine are preferred examples of aromatic ring systems.

In a preferred moiety of general formula (II) $X^{11}$ is $C-R^{15}$, and $R^{12}$ and $R^{15}$ together may be $-(C-R^{18})_3-$, with $R^{18}$ as defined below.

Other preferred moieties of general formula (II) may be selected from one of the following:
(i) $R^{13}$ and $R^{14}$ together may be $-(C-R^{18})_4-$, with $R^{18}$ as defined below; or
(ii) $X^{14}$ is $N-R^{17}$ and $R^{13}$ and $R^{17}$ together may be selected from the group consisting of $-(C-R^{18})_3-$, $-(C-R^{18})_2-$ and $-(C-R^{18})-$, with $R^{18}$ as defined below; or
(iii) $X^{14}$ is $N-R^{17}$ and $R^{13}$, $R^{14}$ and $R^{17}$ together may be $-(C-R^{18})_2-N-(C-R^{18})_3-$, with $R^{18}$ as defined below, or
(iv) $X^{13}$ is $N-R^{16}$, or
(v) $X^{12}$ is $-C(=O)-$, $X^{13}$ is $N-R^{16}$ and $X^{14}$ is $-C(=O)-$,
optionally in combination with $X^{11}$ being $C-R^{15}$, and $R^{12}$ and $R^{15}$ together being $-(C-R^{18})_3-$, with $R^{18}$ as defined below.

$R^{18}$ may be selected from the group consisting of H, F, methyl, ethyl, methyl wherein one or more hydrogen is replaced by fluorine, ethyl wherein one or more hydrogen is replaced by fluorine, or two neighboring groups $R^{18}$ may together form an aromatic ring system having from 6 to 24 aromatic ring atoms, which may in turn be substituted by $R^{19}$ being selected from the group consisting of H, F, ethyl, methyl wherein one or more hydrogen is replaced by fluorine, ethyl wherein one or more hydrogen is replaced by fluorine, $-X^a-$, $-X^a-X^b-$, $-C(=X^a)-X^b-$, $-X^aO_3H$, $-X^a-X^bO_3H$, $-PO_2H_2$ and $-PO_3H_2$, with $X^a$ and $X^b$ being independently of each other S or Se.

Specific examples of moieties of general formula (II) may be selected from the group consisting of formulae (II-A) to (II-D)

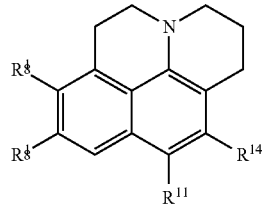
(II-A)

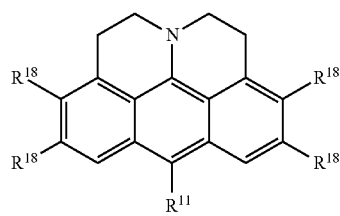
(II-B)

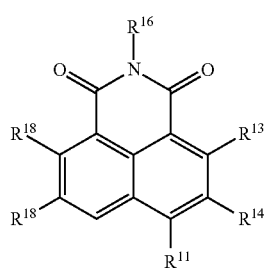
(II-C)

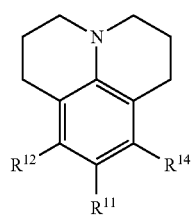
(II-D)

Of these, formulae (II-A) and (II-B) are preferred.

Specific examples of formula (II-A) may be selected from the group consisting of the following formulae (II-A-1) to (II-A-8)

(II-A-1)

(II-A-2)

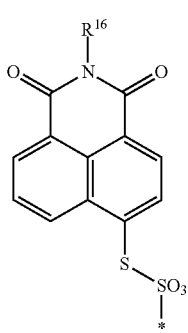
(II-A-3)

(II-A-4) 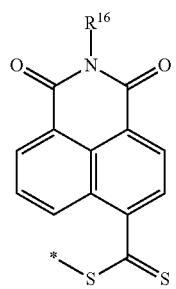
(II-A-5) 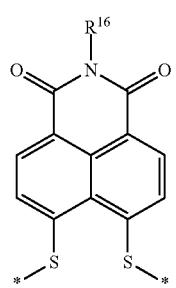
(II-A-6) 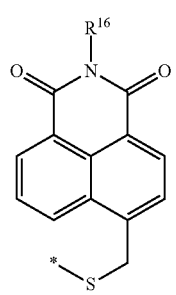
(II-A-7) 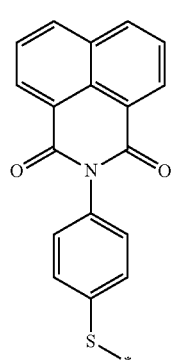
(II-A-8) 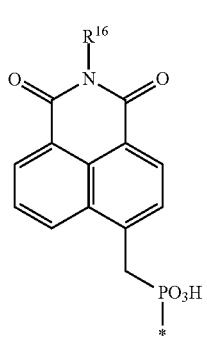
(II-B-1) 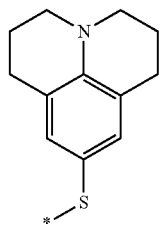
(II-B-2) 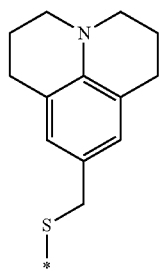
(II-B-3) 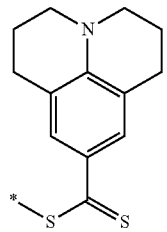
(II-B-4)
(II-B-5) 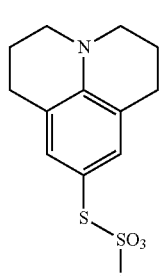
Specific examples of formula (II-B) may be selected from the group consisting of the following formulae (II-B-1) to (II-B-7)

-continued

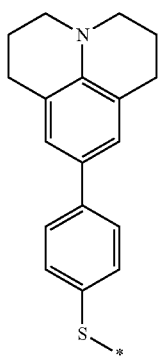

(II-B-6)

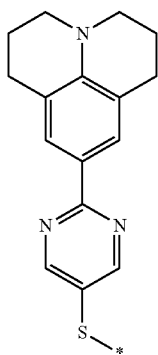

(II-B-7)

with moiety (II-B-1) being preferred.
(SAM-3)
$X^{21}$, $X^{22}$ and $X^{23}$ are independently of each other selected from —N(H)—, —N=, =N—, —C($R^{23}$)=, =C($R^{23}$)— and —S—, wherein at least one of $X^{21}$, $X^{22}$ and $X^{23}$ is different from —C($R^{23}$)= and =C($R^{23}$)—.

$R^{23}$ is on each occurrence independently selected from the group consisting of H, S—*, NH$_2$, alkylene-S—* with alkylene denoting a straight-chain or branched alkylene group with 1 to 18 C atoms, $C_1$-$C_{18}$ thiaalkyl, and straight-chain or branched alkyl with 1 to 15 C atoms, in which one or more non-adjacent C atoms are optionally replaced by —O—, —S—, —NR§-, —CO—, —CO—O—, —O—CO—, —O—CO—O—, —CR§ =CR§§ — or —C≡C— and in which one or more H atoms are optionally replaced by F, Cl, Br, I or CN.

$R^{21}$ and $R^{22}$ are independently of each other F, Cl, or straight-chain or branched alkyl with 1 to 15 C atoms, in which one or more non-adjacent C atoms are optionally replaced by —O—, —S—, —NR§-, —CO—, —CO—O—, —O—CO—, —O—CO—O—, —CR§ =CR§§ — or —C≡C— and in which one or more H atoms are optionally replaced by F, Cl, Br, I or CN, or denote aryl, heteroaryl, aryloxy, heteroaryloxy, arylcarbonyl, heteroarylcarbonyl, arylcarbonyloxy, heteroarylcarbonyloxy, aryloxycarbonyl or heteroaryloxycarbonyl having 2 to 30 C atoms that is unsubstituted or substituted by one or more non-aromatic groups $R^{24}$, or $R^{21}$ and $R^{22}$, together with each other and with the 5-membered heterocycle to which they are attached, form an aromatic or heteroaromatic ring that comprises 5 to 7 ring atoms and is unsubstituted or substituted by 1, 2, 3, 4 or 5 groups $R^{24}$.

R§ and R§§ are independently of each other H or optionally substituted carbyl or hydrocarbyl optionally comprising one or more hetero atoms. Preferably, R§ and R§§ are aryl having from 1 to 10 carbon atoms, aryl having from 1 to 10 carbon atoms substituted with one or more alkyl groups having from 1 to 10 carbon atoms, and alkyl having from 1 to 10 carbon atoms. More preferably R§ and R§§ are alkyl having from 1 to 10 carbon atoms. Most preferably R§ and R§§ are alkyl having from 1 to 5 carbon atoms. Examples of alkyl having from 1 to 5 carbon atoms may be selected from the group consisting of methyl, ethyl, n-propyl, iso-propyl, n-butyl, iso-butyl, tert-butyl, n-pentyl, and iso-pentyl.

$R^{24}$ is on each occurrence identically or differently H, halogen, —CN, —NC, —NCO, —NCS, —OCN, —SCN, —C(=O)NR§ R§§, —C(=O)X⁰, —C(=O)R§, —NH$_2$, —NR§ R§§, —SH, —SR§, —SO$_3$H, —SO$_2$R§, —OH, —NO$_2$, —CF$_3$, —SF$_5$, optionally substituted silyl, carbyl or hydrocarbyl with 1 to 40 C atoms that is optionally substituted and optionally comprises one or more hetero atoms.

$X^0$ is halogen.

The moieties of formula (III) are preferably of formula (III-A)

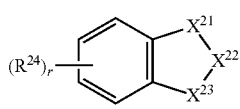

(III-A)

wherein $X^{21}$ is —N(H)—, —C($R^{23}$)= or —S—;
$X^{22}$ is —N=, —N(H)—, —C($R^{23}$)= or —S—;
$X^{23}$ is —N= or —N(H)—;
r is 0, 1, 2, 3 or 4;
and $R^{23}$ and $R^{24}$ are as defined herein.

Preferred compounds of formula (III-A) are selected from the group consisting of the following subformulae (III-A-1) to (III-A-5):

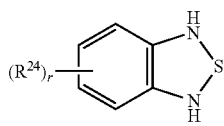

(III-A-1)

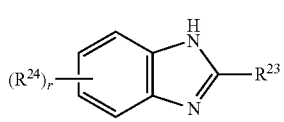

(III-A-2)

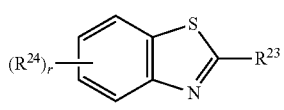

(III-A-3)

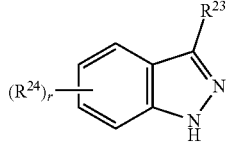

(III-A-4)

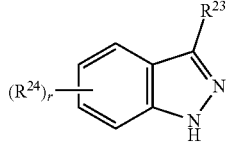

(III-A-5)

wherein $R^{23}$, $R^{24}$ and r are as defined herein.

In respect to formulae (III-A-3), (III-A-4) and (III-A-5), $R^{23}$ is preferably H, S—*, NH$_2$, -alkylene-S—*, wherein alkylene denotes a straight-chain or branched alkylene group with 1 to 18 C atoms, or $C_1$-$C_{18}$ thiaalkyl.

$R^{24}$ preferably denotes, on each occurrence identically or differently, F or $C_1$-$C_{15}$ perfluoroalkyl, very preferably F or perfluoroalkyl with 1, 2, 3 or 4 C atoms.

Preferred moieties of formula (III-A-1) are selected from the group consisting of the following subformulae (III-A-1a) to (III-A-1g):

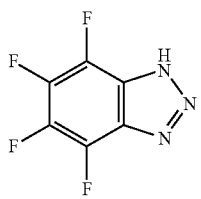
(III-A-1a)

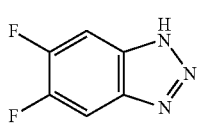
(III-A-1b)

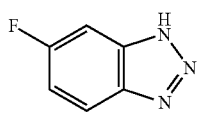
(III-A-1c)

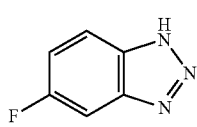
(III-A-1d)

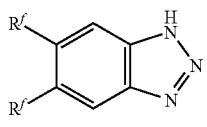
(III-A-1e)

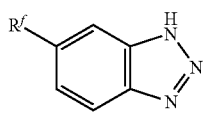
(III-A-1f)

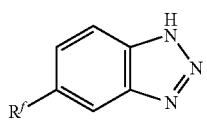
(III-A-1g)

wherein $R^f$ is at each occurrence independently straight chain or branched perfluoroalkyl having 1 to 15 C atoms, which is preferably straight chain and/or preferably has 1, 2, 3 or 4 C atoms. Especially preferred are moieties of formulae (III-A-1e), (III-A-1f) and (III-A-1g), wherein $R^f$ is at each occurrence independently selected from the group consisting of $CF_3$, $C_2F_5$, n-$C_3F_7$, and n-$C_4F_9$.

Preferred moieties of formula (III-A-2) are selected from the group consisting of the following subformulae (III-A-2a) to (III-A-2g):

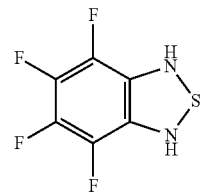
(III-A-2a)

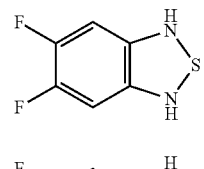
(III-A-2b)

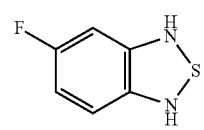
(III-A-2c)

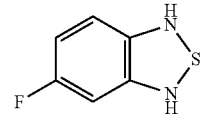
(III-A-2d)

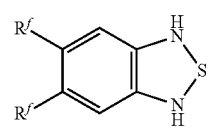
(III-A-2e)

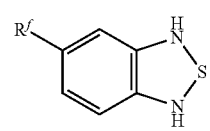
(III-A-2f)

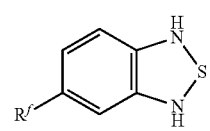
(III-A-2g)

wherein $R^f$ is at each occurrence independently straight chain or branched perfluoroalkyl having 1 to 15 C atoms, which is preferably straight chain and/or preferably has 1, 2, 3 or 4 C atoms. Especially preferred are moieties of formula (III-A-2e), (III-A-2f) and (III-A-2g), wherein $R^f$ is at each occurrence independently selected from the group consisting of $CF_3$, $C_2F_5$, n-$C_3F_7$, and n-$C_4F_9$.

Preferred moieties of formula (III-A-3) are those wherein $R^{23}$ is H, such moieties very preferably selected from the group consisting of the following subformulae (III-A-3a) to (III-A-3g):

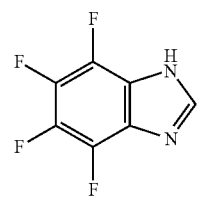
(III-A-3a)

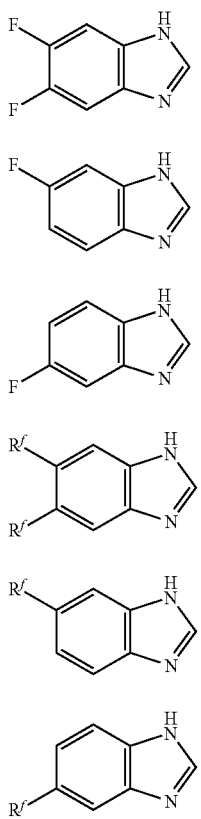

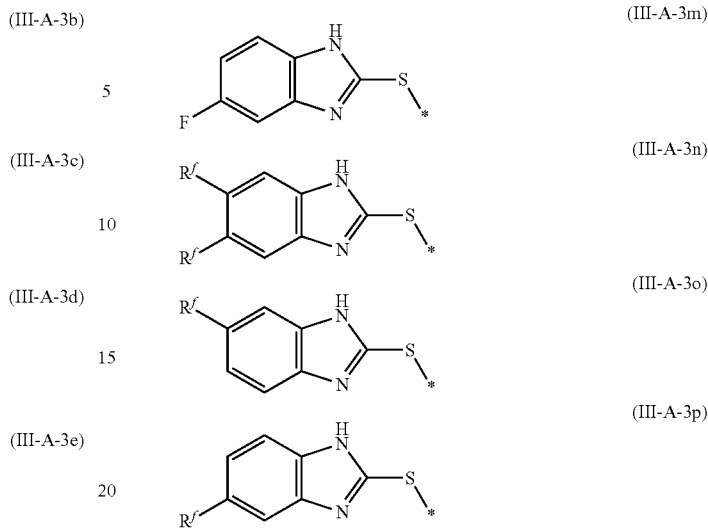

wherein $R^f$ is at each occurrence independently straight chain or branched perfluoroalkyl having 1 to 15 C atoms, which is preferably straight chain and/or preferably has 1, 2, 3 or 4 C atoms. Especially preferred are moieties of formulae (III-A-3n), (III-A-3o) and (III-A-3p), wherein $R^f$ is at each occurrence independently selected from the group consisting of $CF_3$, $C_2F_5$, n-$C_3F_7$, and n-$C_4F_9$.

Further preferred moieties of formula (III-A-3) are those wherein $R^{23}$ is alkylene-S—*, wherein "alkyene" denotes a straight-chain or branched alkylene group with 1 to 18 C atoms, very preferably 1 to 12 C atoms. These moieties are very preferably selected from the group consisting of the following subformulae

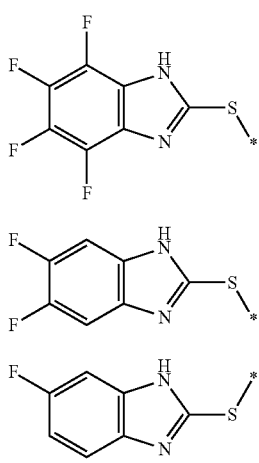

wherein $R^f$ is at each occurrence independently straight chain or branched perfluoroalkyl having 1 to 15 C atoms, which is preferably straight chain and/or preferably has 1, 2, 3 or 4 C atoms. Especially preferred are moieties of formula (III-A-3e), (III-A-3f) and (III-A-3g), wherein $R^f$ is at each occurrence independently selected from the group consisting of $CF_3$, $C_2F_5$, n-$C_3F_7$, and n-$C_4F_9$.

Further preferred moieties of formula (III-A-3) are those wherein $R^{23}$ is —S—*, such moieties very preferably selected from the group consisting of the following subformulae (III-A-3h) to (III-A-3p):

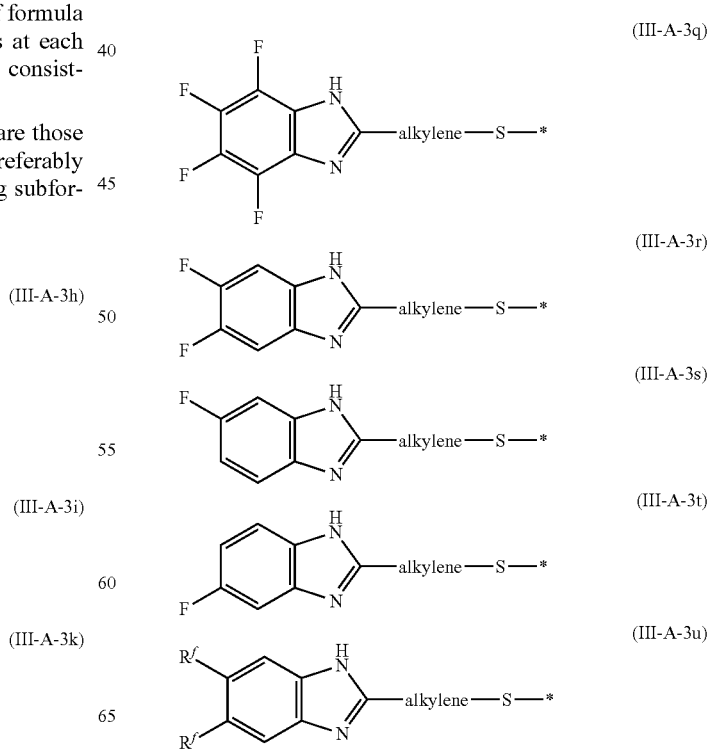

-continued

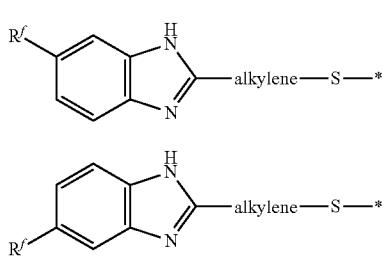

(III-A-3v)

(III-A-3w)

wherein $R^f$ is at each occurrence independently straight chain or branched perfluoroalkyl having 1 to 15 C atoms, which is preferably straight chain and/or preferably has 1, 2, 3 or 4 C atoms. Especially preferred are moieties of formula (III-A-3u), (III-A-3v) and (III-A-3w), wherein $R^f$ is at each occurrence independently selected from the group consisting of $CF_3$, $C_2F_5$, n-$C_3F_7$, and n-$C_4F_9$.

Preferred moieties of formula (III-A-4) are those wherein $R^{23}$ is —S-w, very preferably selected from the group consisting of the following subformulae (III-A-4a) to (III-A-4g):

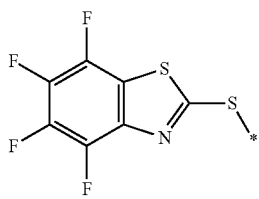

(III-A-4a)

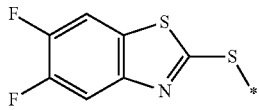

(III-A-4b)

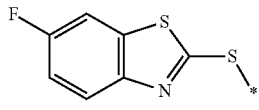

(III-A-4c)

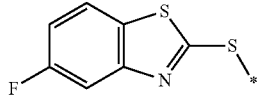

(III-A-4d)

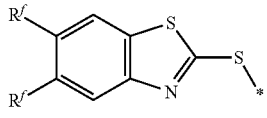

(III-A-4e)

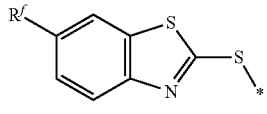

(III-A-4f)

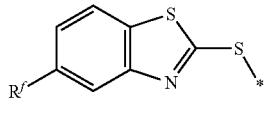

(III-A-3g)

wherein $R^f$ is at each occurrence independently straight chain or branched perfluoroalkyl having 1 to 15 C atoms, which is preferably straight chain and/or preferably has 1, 2, 3 or 4 C atoms. Especially preferred are moieties of formula (III-A-4e), (III-A-4f) and (III-A-4g), wherein $R^f$ is at each occurrence selected independently from the group consisting of $CF_3$, $C_2F_5$, n-$C_3F_7$, and n-$C_4F_9$.

Further preferred moieties of formula (III-A-4) are those wherein $R^{23}$ is alkylene-S—*, wherein "alkyene" denotes a straight-chain or branched alkylene group with 1 to 18 C atoms, very preferably 1 to 12 C atoms. These moieties are very preferably selected from the group consisting of the following subformulae (III-A-4h) to (III-A-4p):

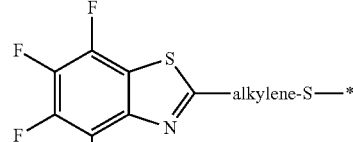

(III-A-4h)

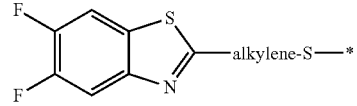

(III-A-4i)

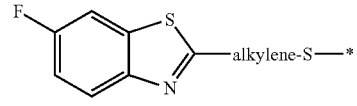

(III-A-4k)

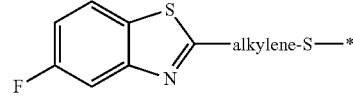

(III-A-4m)

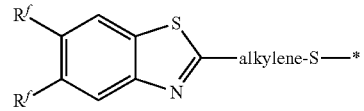

(III-A-4n)

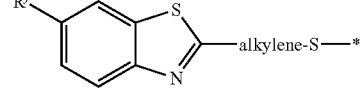

(III-A-4o)

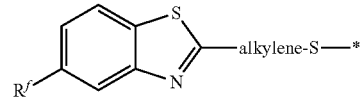

(III-A-4p)

wherein $R^f$ is at each occurrence independently straight chain or branched perfluoroalkyl having 1 to 15 C atoms, which is preferably straight chain and/or preferably has 1, 2, 3 or 4 C atoms. Especially preferred are moieties of formulae (III-A-4n), (III-A-4o) and (III-A-4p), wherein $R^f$ is at each occurrence independently selected from the group consisting of $CF_3$, $C_2F_5$, n-$C_3F_7$, and n-$C_4F_9$.

Preferred moieties of formula (III-A-5) are selected from the group consisting of the following subformulae (III-A-5a) to (III-A-5g):

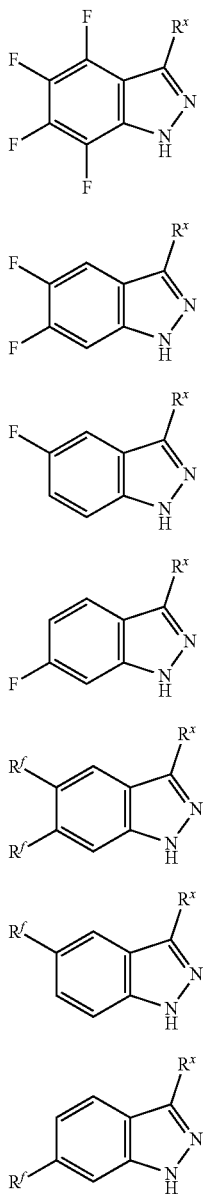

(III-A-5a)
(III-A-5b)
(III-A-5c)
(III-A-5d)
(III-A-5e)
(III-A-5f)
(III-A-5g)

wherein $R^f$ is at each occurrence independently straight chain or branched perfluoroalkyl having 1 to 15 C atoms, which is preferably straight chain and/or preferably has 1, 2, 3 or 4 C atoms, and $R^{23}$ is as herein and very preferably is H, SH or $NH_2$. Especially preferred are moieties of formulae (III-A-5e), (III-A-5f) and (III-A-5g), wherein $R^f$ is at each occurrence independently selected from the group consisting of $CF_3$, $C_2F_5$, n-$C_3F_7$, and n-$C_4F_9$. Further preferred are moieties of formulae (III-A-5a) to (III-A-5g) wherein $R^{23}$ is $NH_2$.

The compounds of formulae (I), (II), (III) and their respective subformulae are commercially available, for example from ACES Pharma (US), or can be synthesized by conventional synthesis methods that are known to the skilled person and have been described in the literature.

Organic Semiconducting Material

The organic semiconducting material is not particularly limited. Any organic semiconducting material may be used, such as for example so-called "small molecules" or polymers. The term "small molecules" refers to organic semiconducting compounds that generally have a molecular weight of at most 1000 g $mol^{-1}$, preferably of at most 500 g $mol^{-1}$.

The organic semiconducting material can either be an n-type or p-type semiconducting material. Preferably, said organic semiconducting material has a field effect transistor mobility of at least $1*10^{-5}$ $cm^2$ $V^{-1}$ $s^{-1}$.

Preferably the organic semiconducting layer is solid. Preferably the semiconducting layer comprises, and preferably consists of, one or more, preferably one, organic semiconducting material. Preferably, said semiconducting material has a transistor mobility of at least $1*10-5$ $cm^2$ $V^{-1}$ $s^{-1}$ and/or the energy level of the highest occupied molecular orbital (HOMO) of the semiconducting material (p type) or LUMO (n-type) is matched to the energy level work function of the third electrode layer.

The semiconducting layer preferably has a thickness of at least 0.5 μm, more preferably of at least 1.0 μm, and of at most 20 μm, more preferably of at most 15 μm and most preferably of at most 10 am.

The organic semiconducting material is preferably selected from the group consisting of monomeric compounds (also referred to as "small molecule"), oligomers, polymers or blends of any of these, for example, including but not limited to blends of one or more monomeric compounds, one or more oligomers or one or more polymers. More preferably the organic semiconducting material is a polymer or a blend of polymers. Most preferably the organic semiconducting material is a polymer.

The type of organic semiconducting material is not particularly limited. In general the organic semiconducting material comprises a conjugated system. The term "conjugated system" is herein used to denote a molecular entity or a part of a molecular entity whose structure may be represented as a system of alternating single and multiple bonds (see also International Union of Pure and Applied Chemistry, Compendium of Chemical Terminology, Gold Book, Version 2.3.3, 2014 Feb. 24, pages 322-323).

An organic semiconducting material suited for use herein may, for example, be represented by the following formula (V)

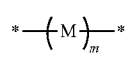

(V)

wherein monomeric unit M and m are as defined herein. At each occurrence M may be selected independently.

With regards to formula (V) m may be any integer from 1 to 100,000. For a monomer or monomeric unit m is 1. For an oligomer m is at least 2 and at most 10. For a polymer m is at least 11.

Preferably, the organic semiconducting material comprises one or more aromatic units. Expressed differently, with regards to formula (V) M may be an aromatic unit. Such aromatic units preferably comprise two or more, more preferably three or more aromatic rings. Such aromatic rings may, for example, at each occurrence independently be selected from the group consisting of 5-, 6-, 7- and 8-membered aromatic rings, with 5- and 6-membered rings being particularly preferred.

These aromatic rings comprised in the organic semiconducting material optionally comprise one or more heteroatoms selected from Se, Te, P, Si, B, As, N, O or S, preferably from Si, N, O or S. Further, these aromatic rings may optionally be substituted with alkyl, alkoxy, polyalkoxy, thioalkyl, acyl, aryl or substituted aryl groups, halogen, with fluorine being the preferred halogen, cyano, nitro or an optionally substituted secondary or tertiary alkylamine or arylamine represented by —N(R')(R"), where R' and R" are each independently H, an optionally substituted alkyl or an optionally substituted aryl, alkoxy or polyalkoxy groups are typically employed. Further, where R' and R" is alkyl or aryl these may be optionally fluorinated.

The aforementioned aromatic rings can be fused rings or linked to each other by a conjugated linking group such as —C(T$_1$)=C(T$_2$)—, —C≡C—, —N(R''')—, —N=N—, (R''')=N—, —N=C(R''')—, where T$_1$ and T$_2$ each independently represent H, Cl, F, —C≡N or lower alkyl groups such as C$_{1-4}$ alkyl groups; R''' represents H, optionally substituted alkyl or optionally substituted aryl. Further, where R''' is alkyl or aryl, it may be optionally fluorinated.

Further preferred organic semiconducting materials may be polymers or copolymers wherein the monomeric units M of formula (V) may at each occurrence be independently selected from the group consisting of formulae (A1) to (A83) and (D1) to (D142)

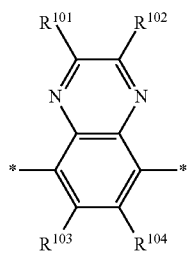

(A1)

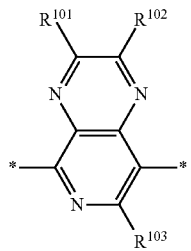

(A2)

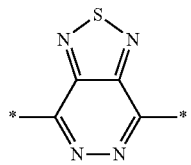

(A3)

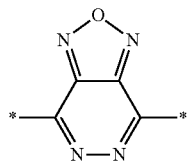

(A4)

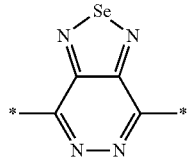

(A5)

-continued

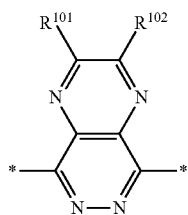

(A6)

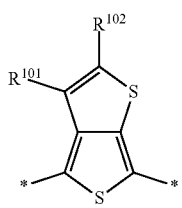

(A7)

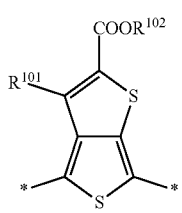

(A8)

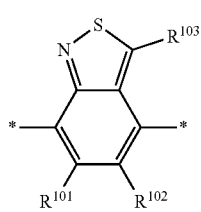

(A9)

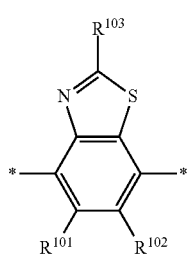

(A10)

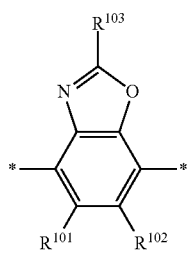

(A11)

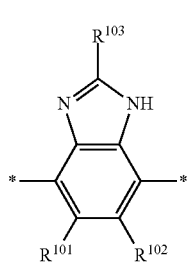

(A12)

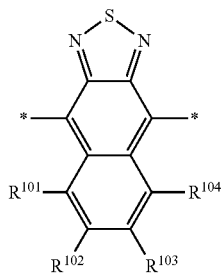
(A13)
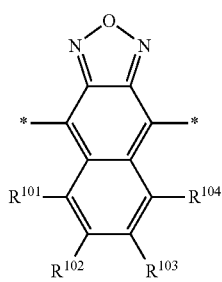
(A14)
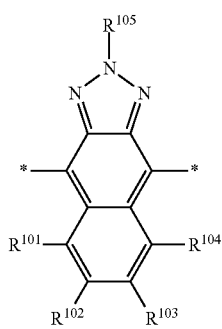
(A15)
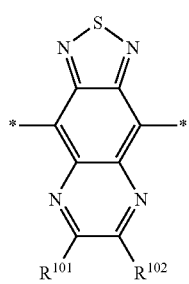
(A16)
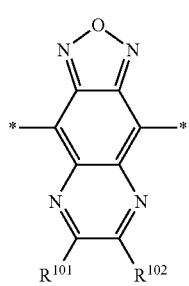
(A17)
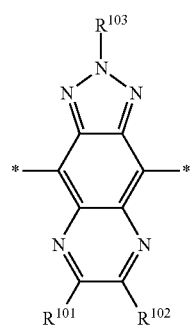
(A18)
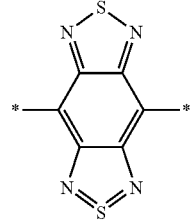
(A19)
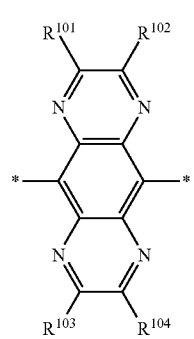
(A20)
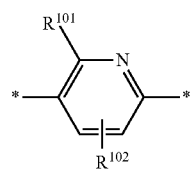
(A21)
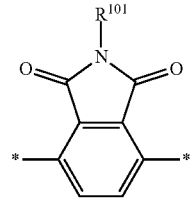
(A22)
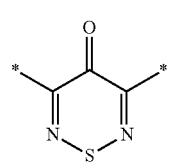
(A23)
(A24)

(A25) 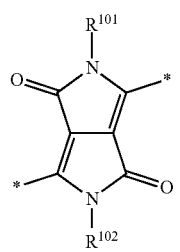
(A26) 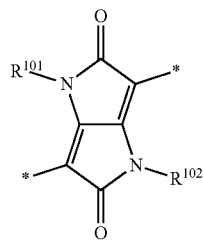
(A27) 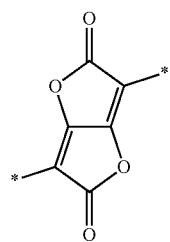
(A28) 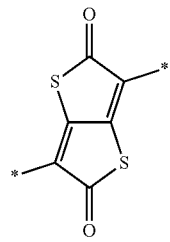
(A29) 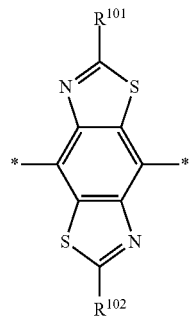
(A30) 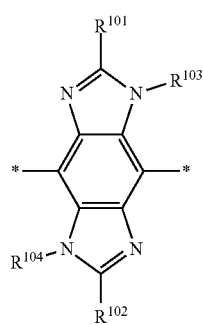
(A31) 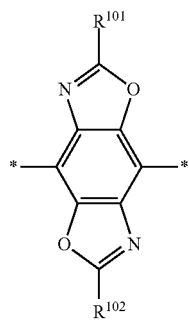
(A32) 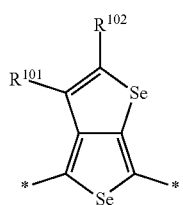
(A33) 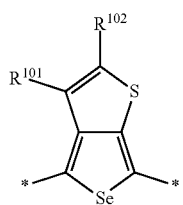
(A34) 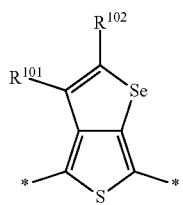
(A35) 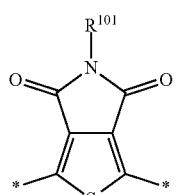
(A36) 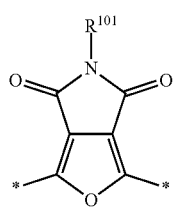

(A37) 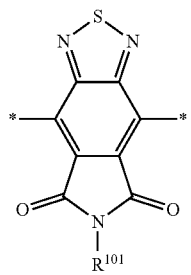
(A38) 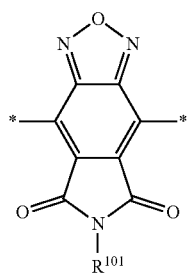
(A39) 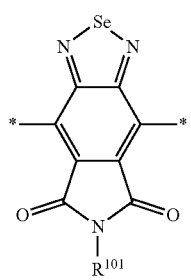
(A40) 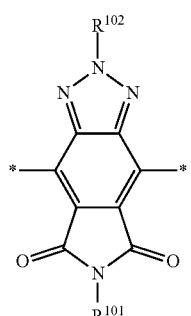
(A41) 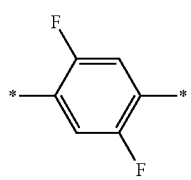
(A42) 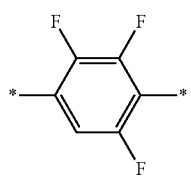
(A43) 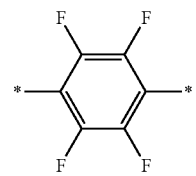
(A44) 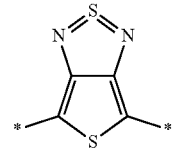
(A45) 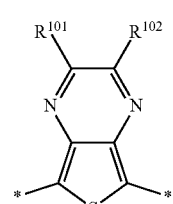
(A46) 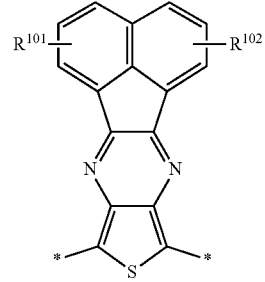
(A47) 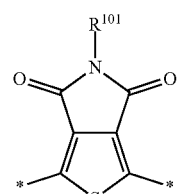
(A48) 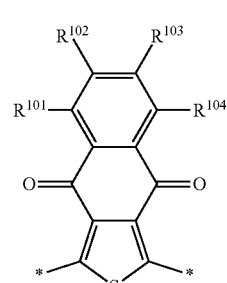
(A49)

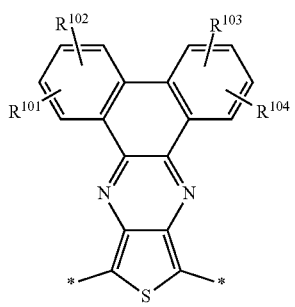 (A50)
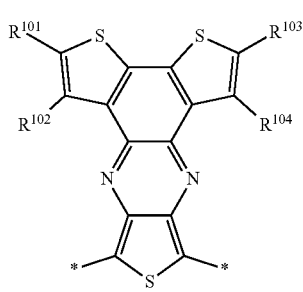 (A51)
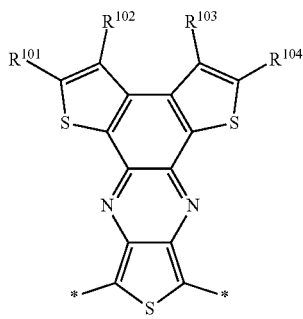 (A52)
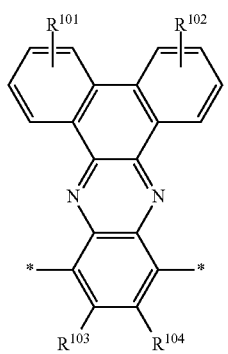 (A53)
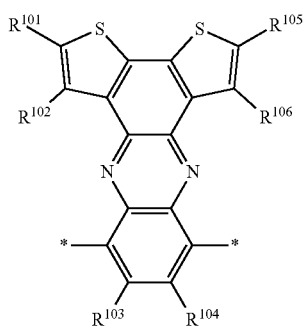 (A54)
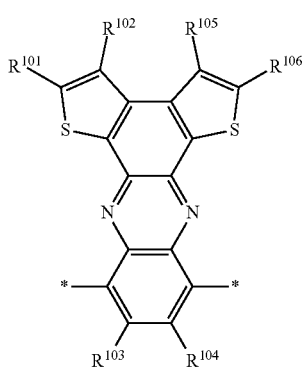 (A55)
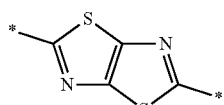 (A56)
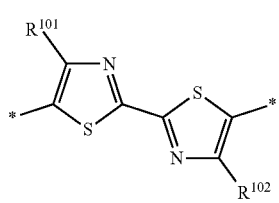 (A57)
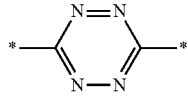 (A58)
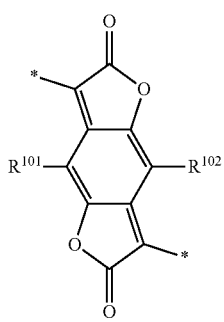 (A59)
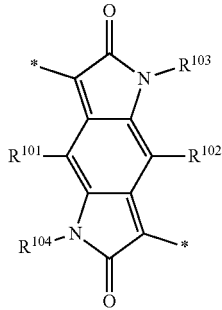 (A60)

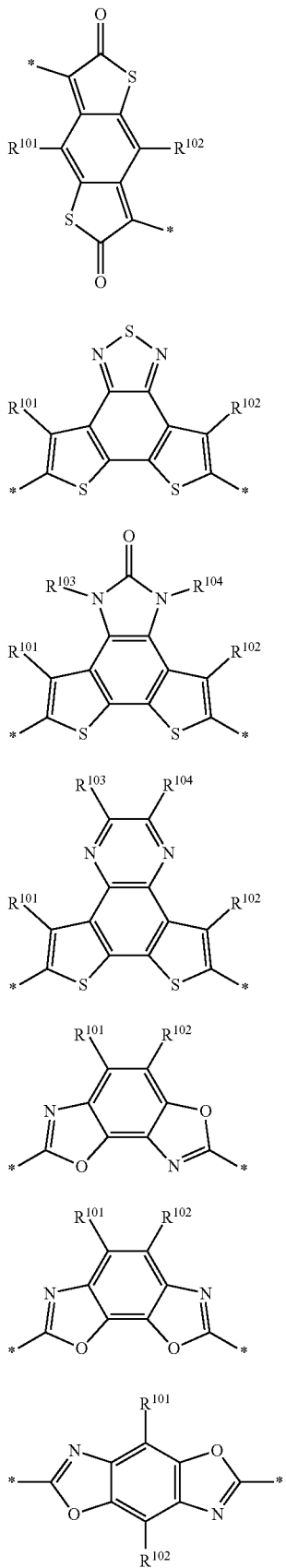
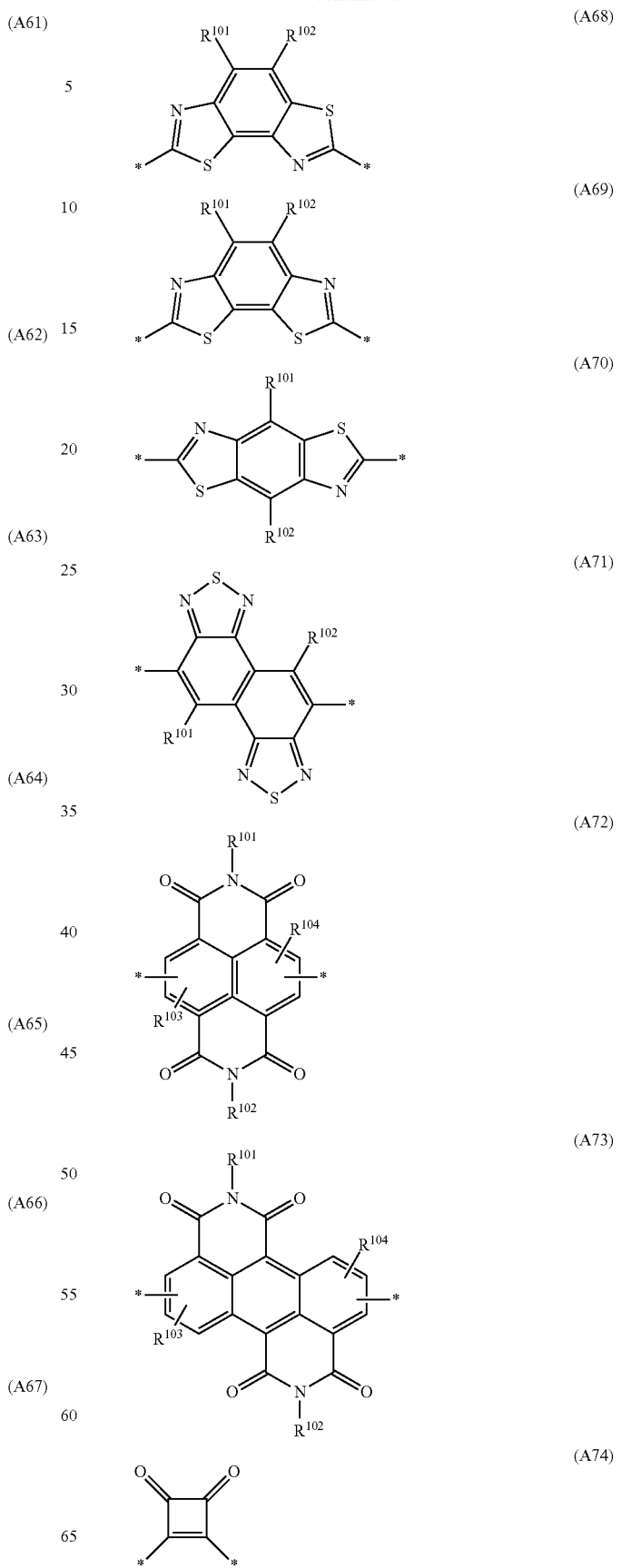

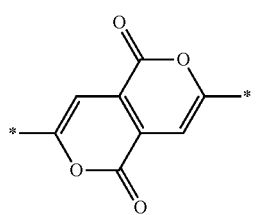
(A75)
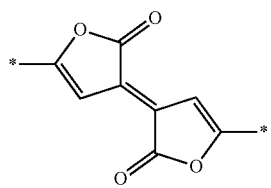
(A76)
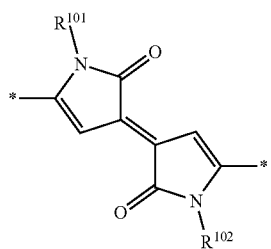
(A77)
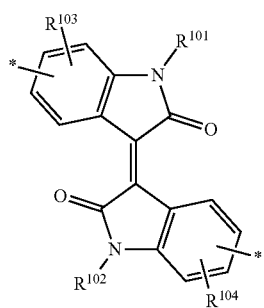
(A78)
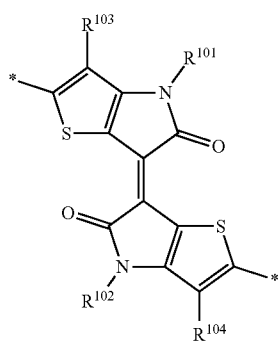
(A79)
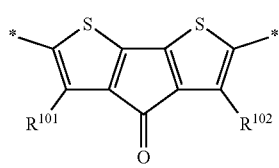
(A80)
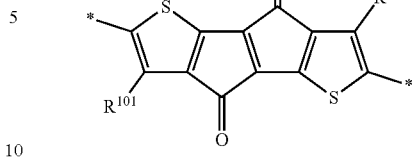
(A81)
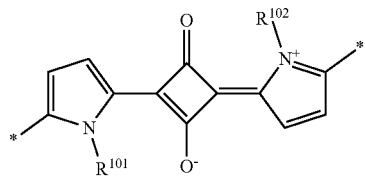
(A82)
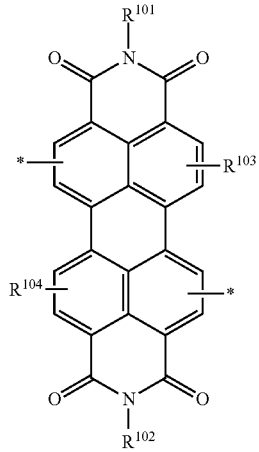
(A83)
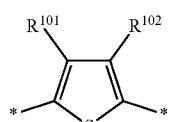
(D1)
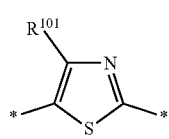
(D2)
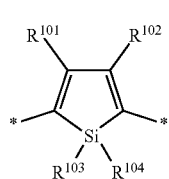
(D3)
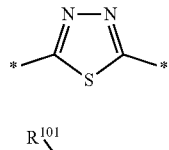
(D4)
(D5)

-continued
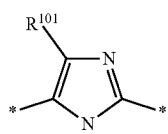
(D6)
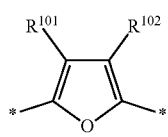
(D7)
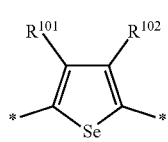
(D8)
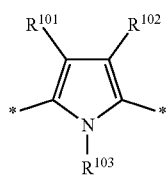
(D9)
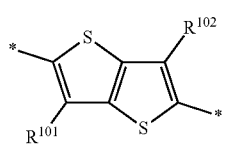
(D10)
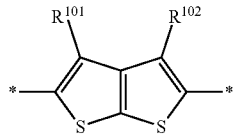
(D11)
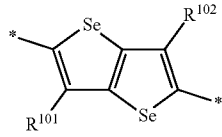
(D12)
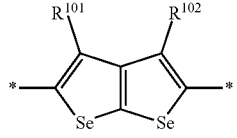
(D13)
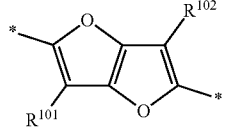
(D14)
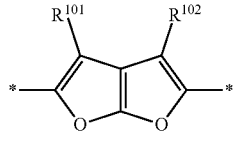
(D15)
-continued
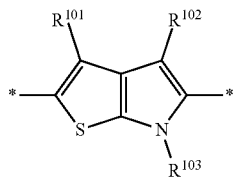
(D16)
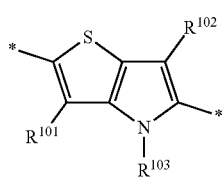
(D17)
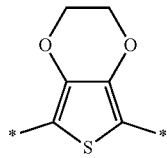
(D18)
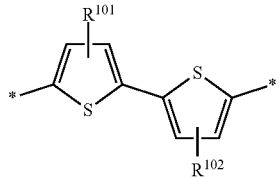
(D19)
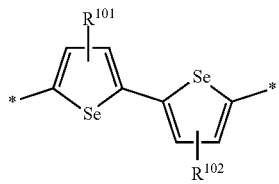
(D20)
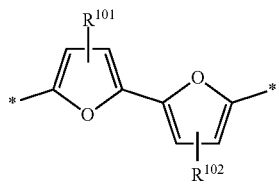
(D21)
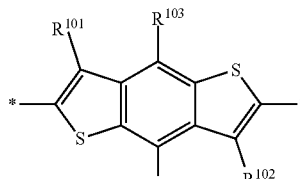
(D22)
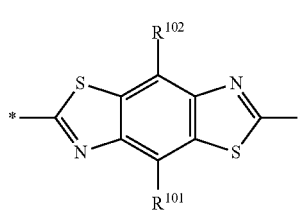
(D23)

-continued
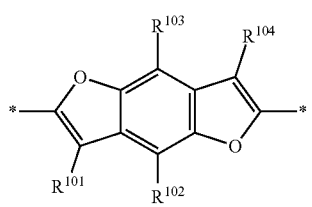
(D24)
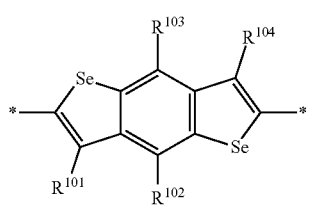
(D25)
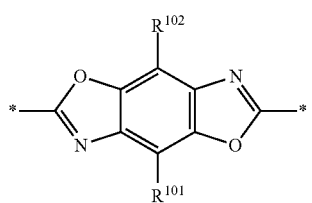
(D26)
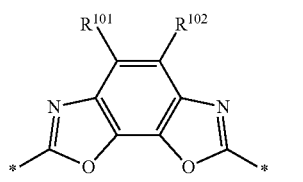
(D27)
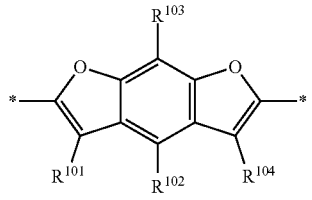
(D28)
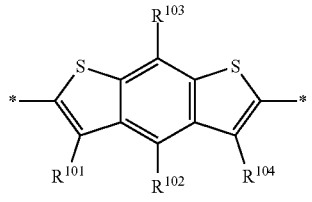
(D29)
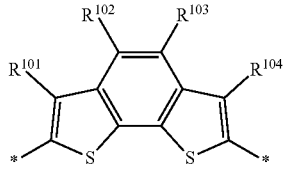
(D30)
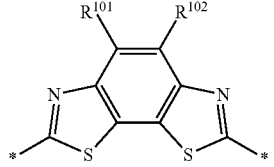
(D31)
-continued
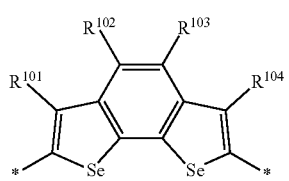
(D32)
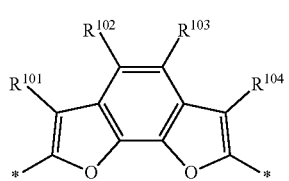
(D33)
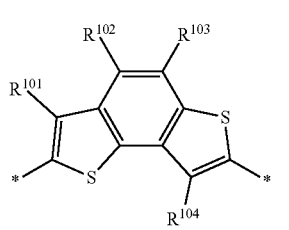
(D34)
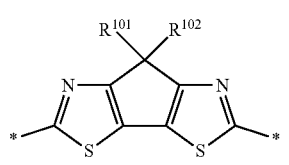
(D35)
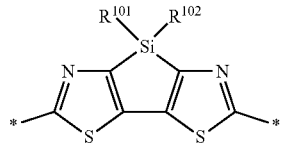
(D36)
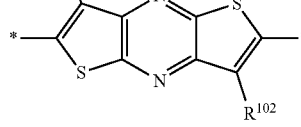
(D37)
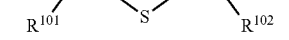
(D38)
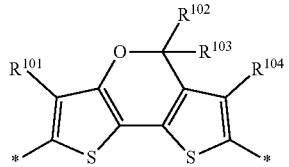
(D39)
(D40)

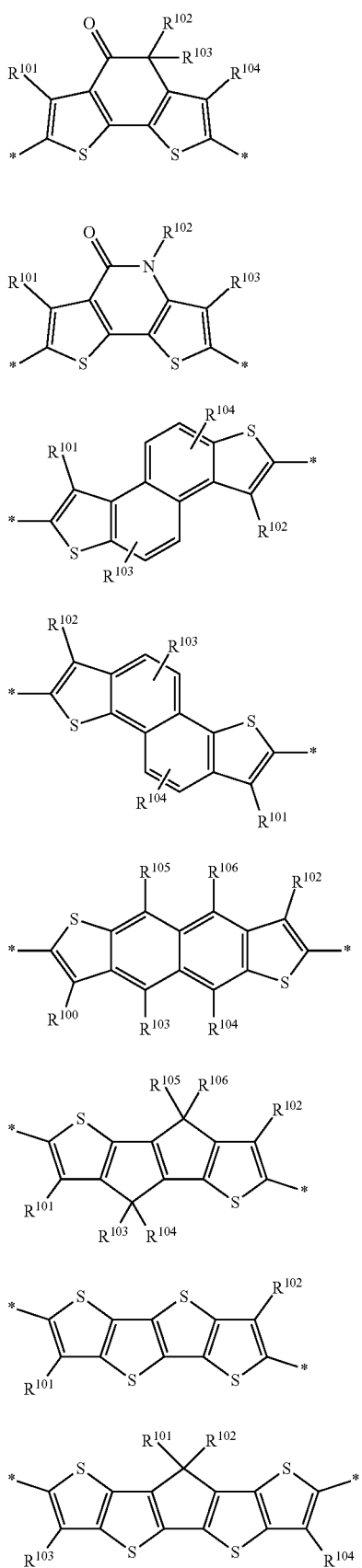
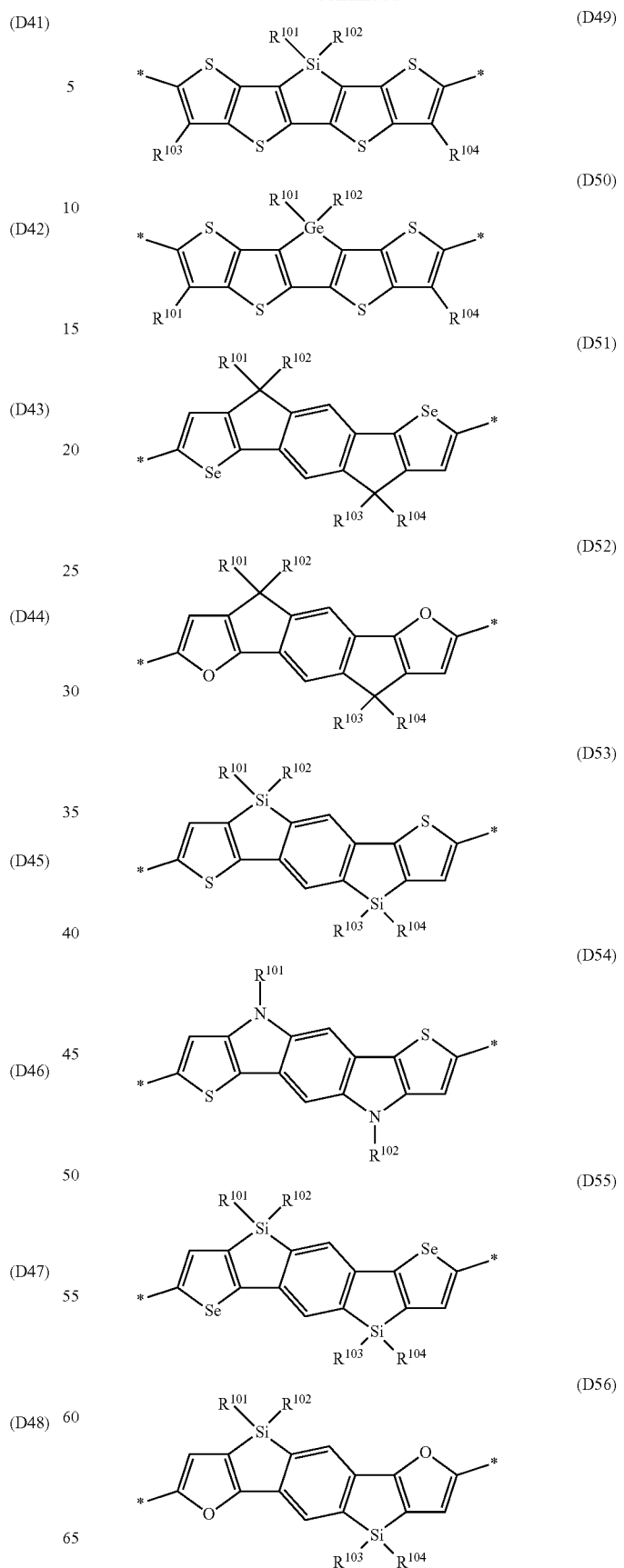

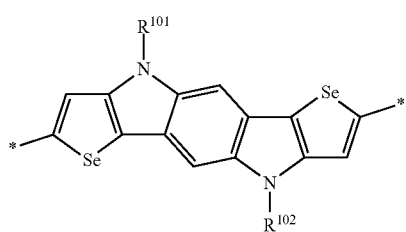
(D57)
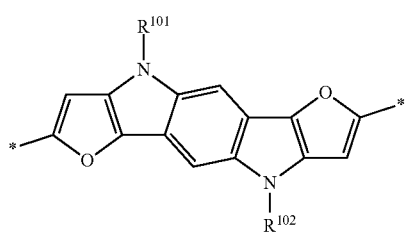
(D58)
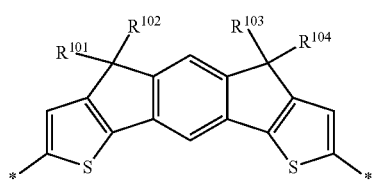
(D59)
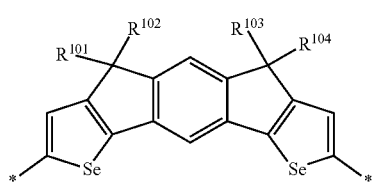
(D60)
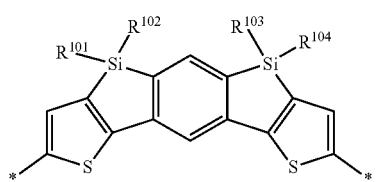
(D61)
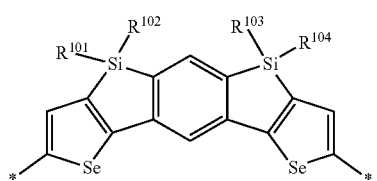
(D62)
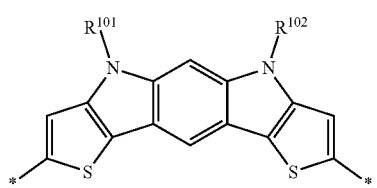
(D63)
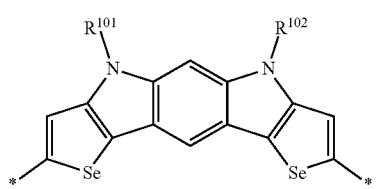
(D64)
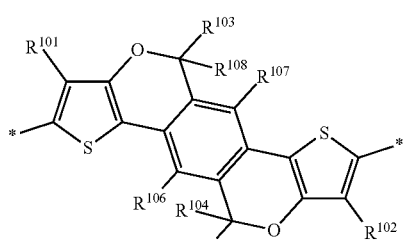
(D65)
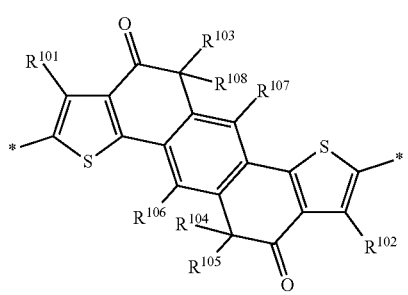
(D66)
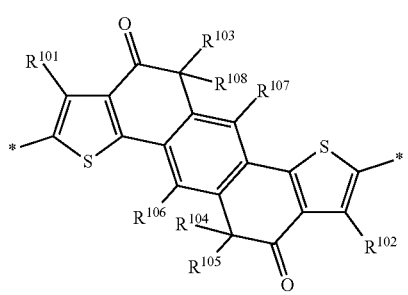
(D67)
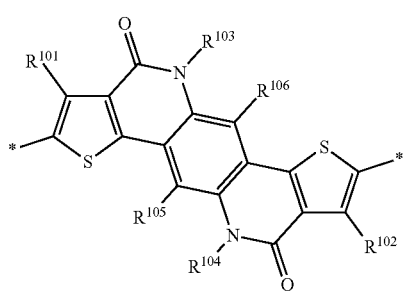
(D68)
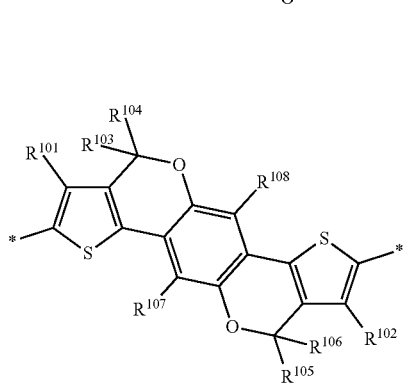
(D69)
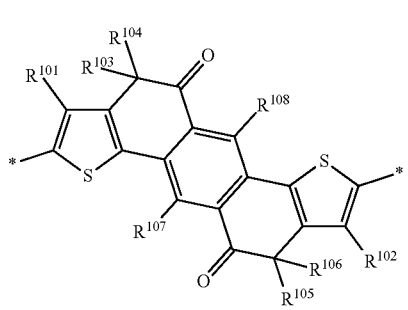

-continued
(D70) 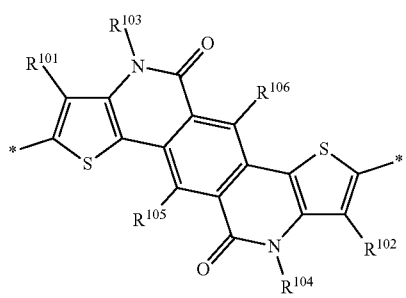
(D71) 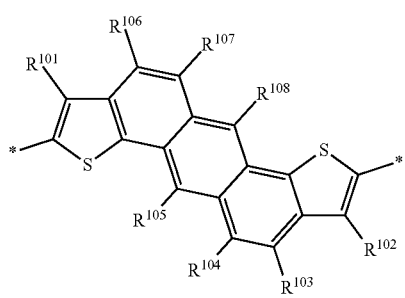
(D72) 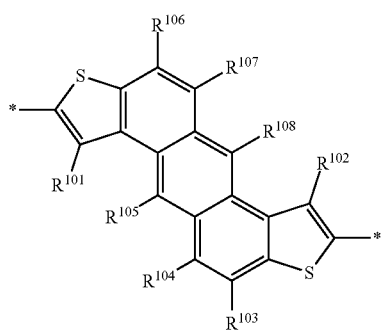
(D73) 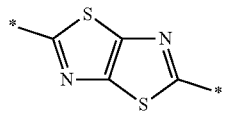
(D74) 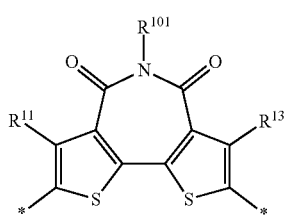
(D75) 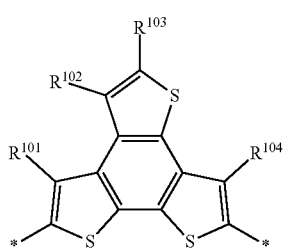
(D76) 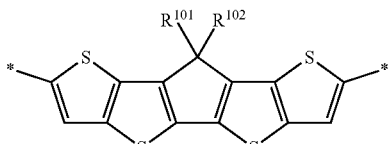
(D77) 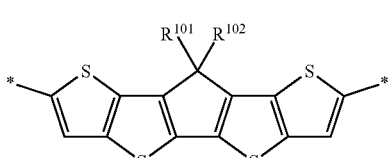
(D78) 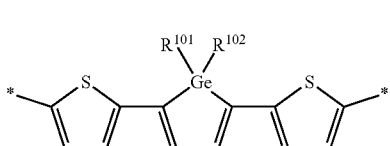
(D79) 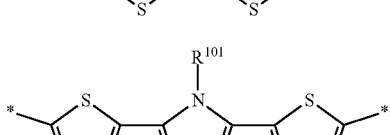
(D80) 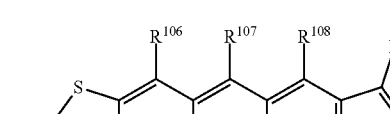
(D81) 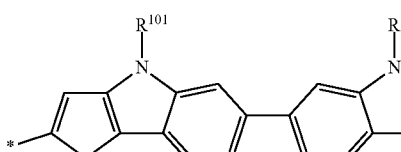
(D82) 
(D83) 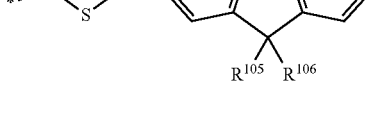

-continued
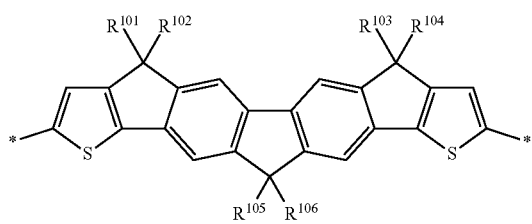
(D84)
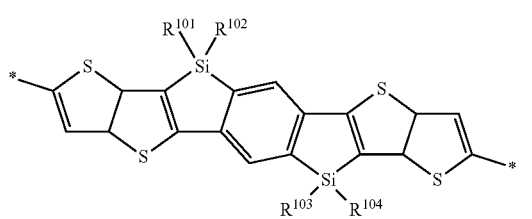
(D85)
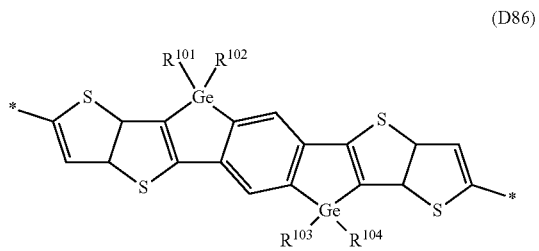
(D86)
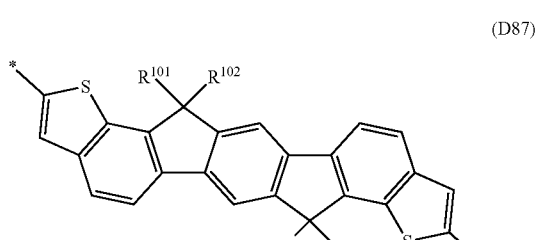
(D87)
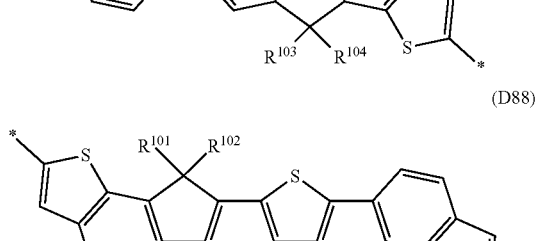
(D88)
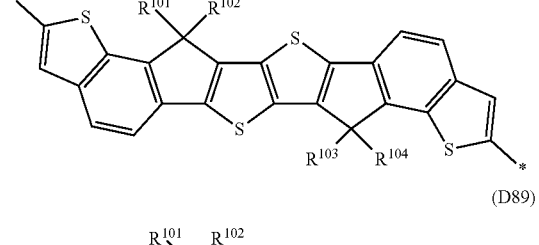
(D89)
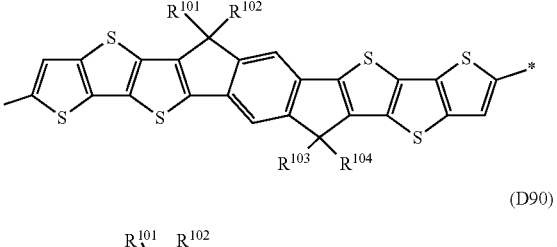
(D90)
-continued
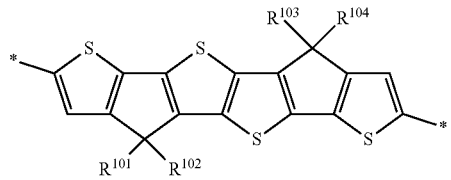
(D91)
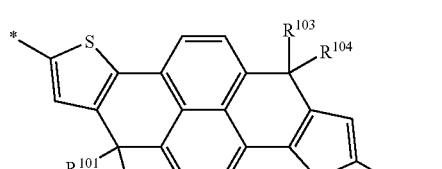
(D92)
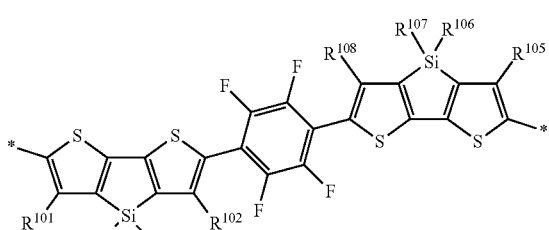
(D93)
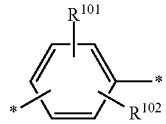
(D94)
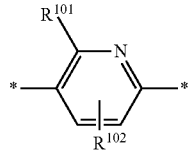
(D95)
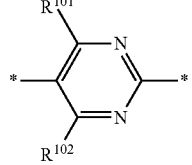
(D96)
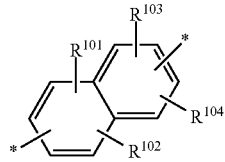
(D97)
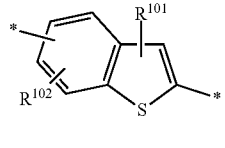
(D98)
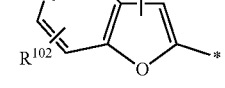
(D99)

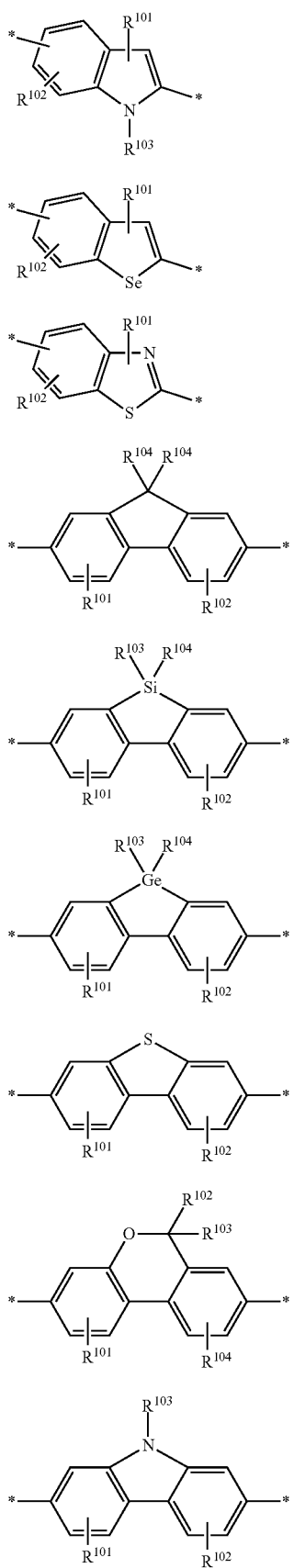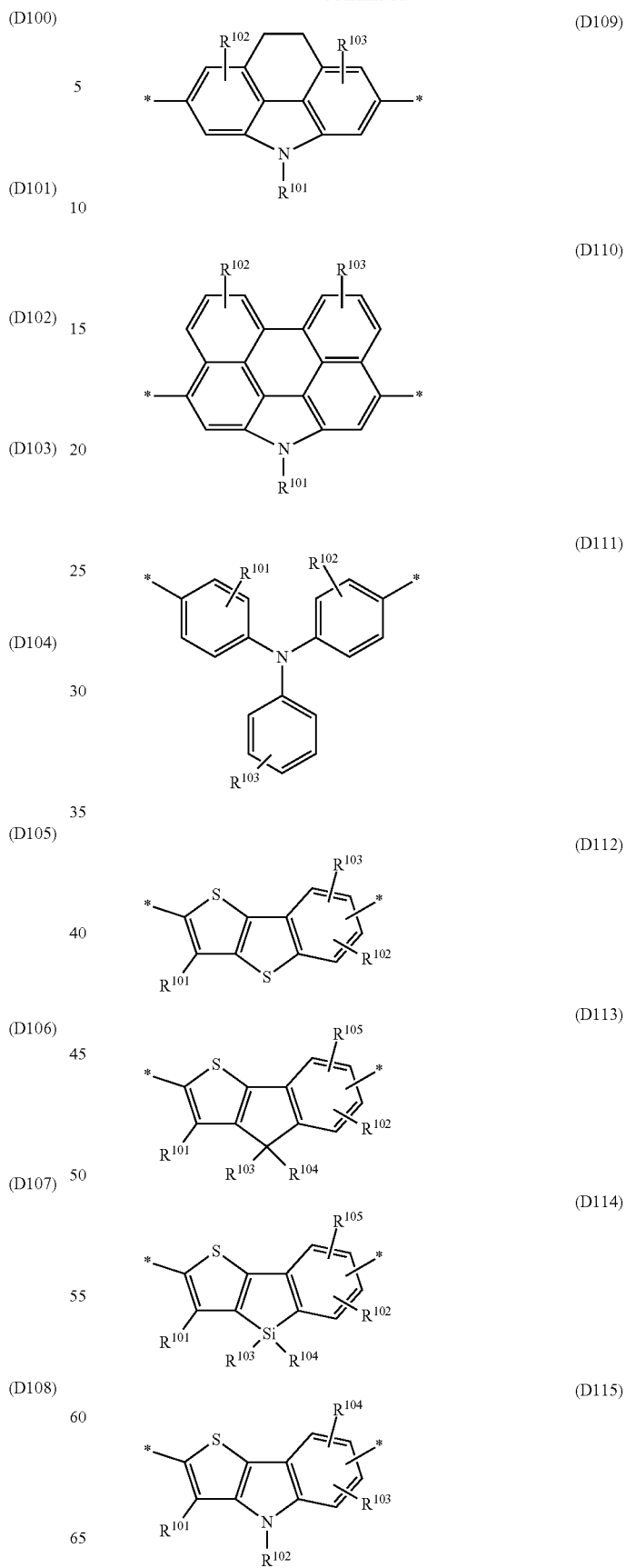

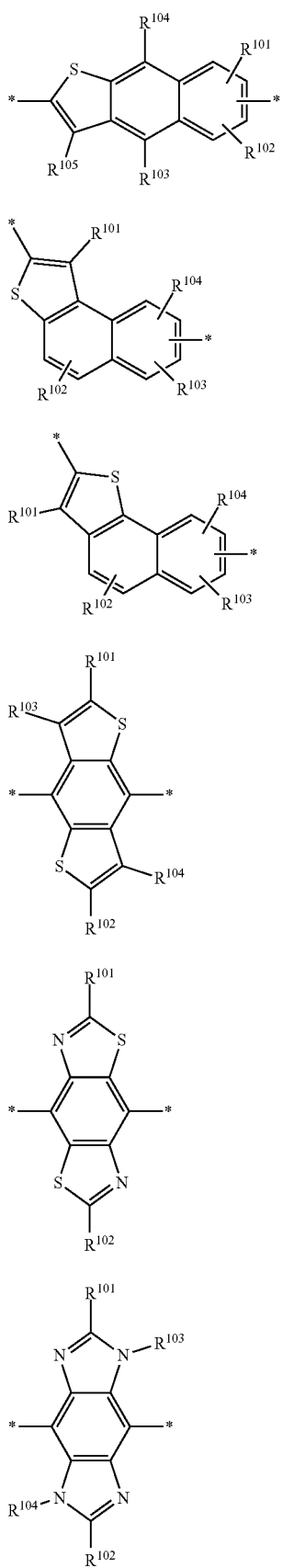
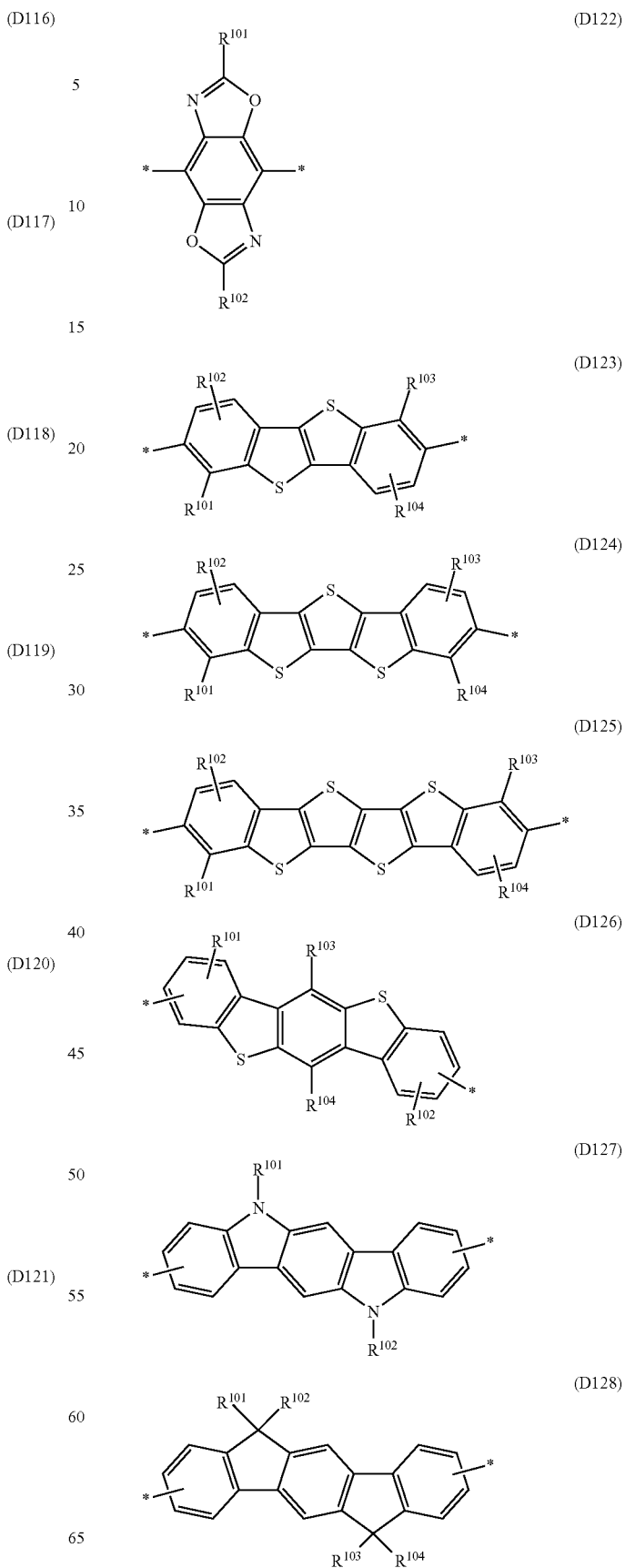

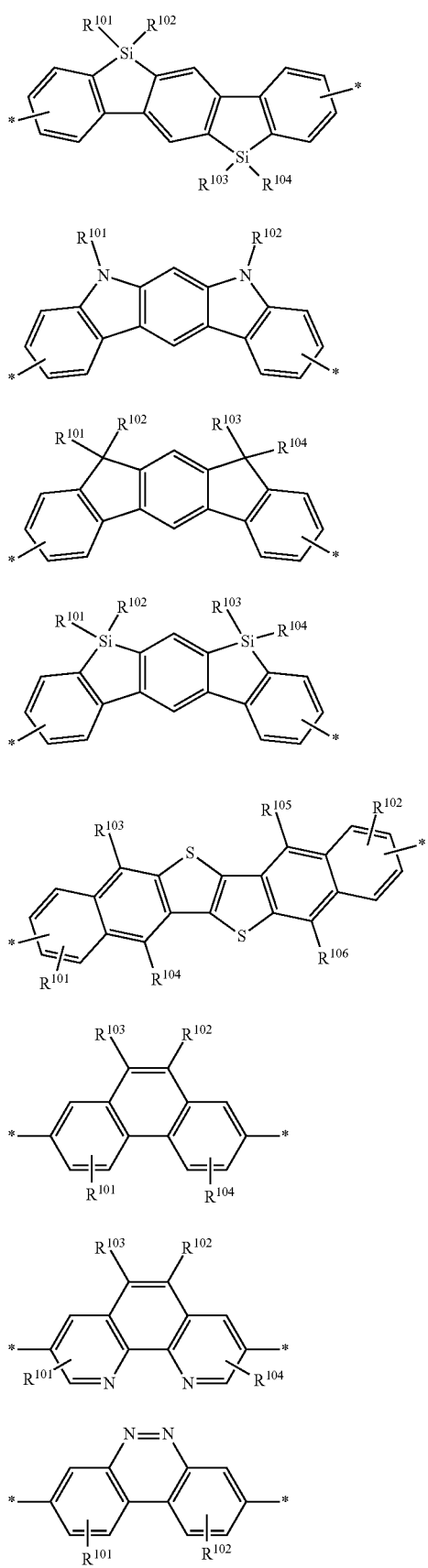
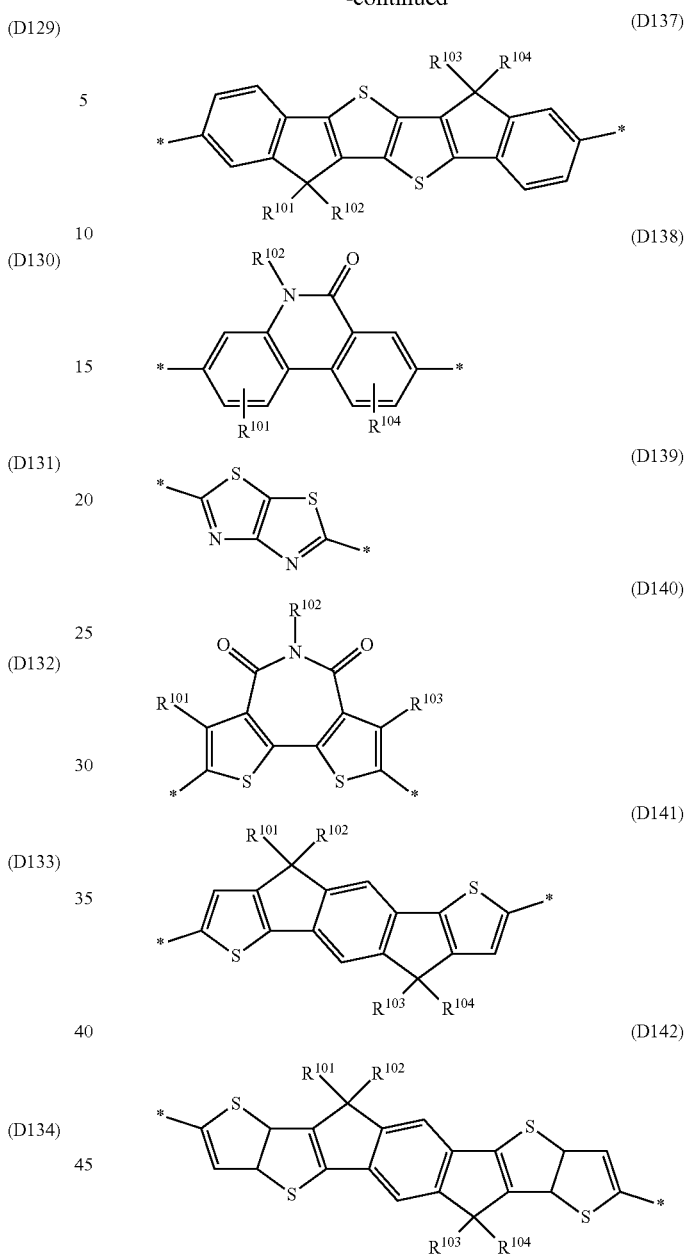

wherein $R^{101}$, $R^{102}$, $R^{103}$, $R^{104}$, $R^{105}$, $R^{106}$, $R^{107}$ and $R^{108}$ are independently of each other selected from the group consisting of H and $R^S$ as defined herein.

$R^S$ is at each occurrence independently a carbyl group as defined herein and preferably selected from the group consisting of any group $R^T$ as defined herein, hydrocarbyl having from 1 to 40 carbon atoms wherein the hydrocarbyl may be further substituted with one or more groups $R^T$, and hydrocarbyl having from 1 to 40 carbon atoms comprising one or more heteroatoms selected from the group consisting of N, O, S, P, Si, Se, As, Te or Ge, with N, O and S being preferred heteroatoms, wherein the hydrocarbyl may be further substituted with one or more groups $R^T$.

Preferred examples of hydrocarbyl suitable as $R^S$ may at each occurrence be independently selected from phenyl, phenyl substituted with one or more groups $R^T$, alkyl and alkyl substituted with one or more groups $R^T$, wherein the alkyl has at least 1, preferably at least 5 and has at most 40, more preferably at most 30 or 25 or 20, even more preferably at most 15 and most preferably at most 12 carbon atoms. It is noted that for example alkyl suitable as $R^S$ also includes fluorinated alkyl, i.e. alkyl wherein one or more hydrogen is replaced by fluorine, and perfluorinated alkyl, i.e. alkyl wherein all of the hydrogen are replaced by fluorine.

$R^T$ is at each occurrence independently selected from the group consisting of F, Br, Cl, —CN, —NC, —NCO, —NCS, —OCN, —SCN, —C(O)NR$^O$R$^{OO}$, —C(O)X$^O$, —C(O)R$^O$, —NH$_2$, —NR$^O$R$^{OO}$, —SH, —SR$^O$, —SO$_3$H, —SO$_2$R, —OH, —OR$^O$, —NO$_2$, —SF$_5$ and —SiR$^O$R$^{OO}$R$^{OOO}$. Preferred $R^T$ are selected from the group consisting of F, Br, Cl, —CN, —NC, —NCO, —NCS, —OCN, —SCN, —C(O)NR$^O$R$^{OO}$, —C(O)X$^O$, —C(O)R$^O$, —NH$_2$, —NR$^O$R$^{OO}$, —SH, —SR$^O$, —OH, —OR$^O$ and —SiR$^O$R$^{OO}$R$^{OOO}$. Most preferred $R^T$ is F.

$R^O$, $R^{OO}$ and $R^{OOO}$ are at each occurrence independently of each other selected from the group consisting of H, F and hydrocarbyl having from 1 to 40 carbon atoms. Said hydrocarbyl preferably has at least 5 carbon atoms. Said hydrocarbyl preferably has at most 30, more preferably at most 25 or 20, even more preferably at most 20, and most preferably at most 12 carbon atoms. Preferably, $R^O$, $R^{OO}$ and $R^{OOO}$ are at each occurrence independently of each other selected from the group consisting of H, F, alkyl, fluorinated alkyl, alkenyl, alkynyl, phenyl and fluorinated phenyl. More preferably, $R^O$, $R^{OO}$ and $R^{OOO}$ are at each occurrence independently of each other selected from the group consisting of H, F, alkyl, fluorinated, preferably perfluorinated, alkyl, phenyl and fluorinated, preferably perfluorinated, phenyl.

It is noted that for example alkyl suitable as $R^O$, $R^{OO}$ and $R^{OOO}$ also includes perfluorinated alkyl, i.e. alkyl wherein all of the hydrogen are replaced by fluorine. Examples of suitable alkyls may be selected from the group consisting of methyl, ethyl, n-propyl, iso-propyl, n-butyl, iso-butyl, tert-butyl (or "t-butyl"), pentyl, hexyl, heptyl, octyl, nonyl, decyl, undecyl, dodecyl, tridecyl, tetradecyl, pentadecyl, hexadecyl, heptadecyl, octadecyl, nonadecyl and eicosyl (—C$_{20}$H$_{41}$).

$X^O$ is halogen. Preferably $X^O$ is selected from the group consisting of F, Cl and Br.

A hydrocarbyl group comprising a chain of 3 or more carbon atoms and heteroatoms combined may be straight chain, branched and/or cyclic, including spiro and/or fused rings.

Hydrocarbyl suitable as $R^S$, $R^O$, $R^{OO}$ and/or $R^{OOO}$ may be saturated or unsaturated. Examples of saturated hydrocarbyl include alkyl. Examples of unsaturated hydrocarbyl may be selected from the group consisting of alkenyl (including acyclic and cyclic alkenyl), alkynyl, allyl, alkyldienyl, polyenyl, aryl and heteroaryl.

Preferred hydrocarbyl suitable as $R^S$, $R^O$, $R^{OO}$ and/or $R^{OOO}$ include hydrocarbyl comprising one or more heteroatoms and may for example be selected from the group consisting of alkoxy, alkylcarbonyl, alkoxycarbonyl, alkylcarbonyloxy and alkoxycarbonyloxy, alkylaryloxy, arylcarbonyl, aryloxycarbonyl, arylcarbonyloxy and aryloxycarbonyloxy.

Preferred examples of aryl and heteroaryl comprise mono-, bi- or tricyclic aromatic or heteroaromatic groups that may also comprise condensed rings.

Especially preferred aryl and heteroaryl groups may be selected from the group consisting of phenyl, phenyl wherein one or more CH groups are replaced by N, naphthalene, fluorene, thiophene, pyrrole, preferably N-pyrrole, furan, pyridine, preferably 2- or 3-pyridine, pyrimidine, pyridazine, pyrazine, triazole, tetrazole, pyrazole, imidazole, isothiazole, thiazole, thiadiazole, isoxazole, oxazole, oxadiazole, thiophene, preferably 2-thiophene, selenophene, preferably 2-selenophene, thieno[3,2-b]thiophene, thieno[2,3-b]thiophene, dithienothiophene, furo[3,2-b]furan, furo[2,3-b]furan, seleno[3,2-b]selenophene, seleno[2,3-b]selenophene, thieno[3,2-b]selenophene, thieno[3,2-b]furan, indole, isoindole, benzo[b]furan, benzo[b]thiophene, benzo[1,2-b;4,5-b']dithiophene, benzo[2,1-b;3,4-b']dithiophene, quinole, 2-methylquinole, isoquinole, quinoxaline, quinazoline, benzotriazole, benzimidazole, benzothiazole, benzisothiazole, benzisoxazole, benzoxadiazole, benzoxazole and benzothiadiazole.

Preferred examples of an alkoxy group, i.e. a corresponding alkyl group wherein the terminal CH$_2$ group is replaced by —O—, can be straight-chain or branched, preferably straight-chain (or linear). Suitable examples of such alkoxy group may be selected from the group consisting of methoxy, ethoxy, propoxy, butoxy, pentoxy, hexoxy, heptoxy, octoxy, nonoxy, decoxy, undecoxy, dodecoxy, tridecoxy, tetradecoxy, pentadecoxy, hexadecoxy, heptadecoxy and octadecoxy.

Preferred examples of alkenyl, i.e. a corresponding alkyl wherein two adjacent CH$_2$ groups are replaced by —CH═CH— can be straight-chain or branched. It is preferably straight-chain. Said alkenyl preferably has 2 to 10 carbon atoms. Preferred examples of alkenyl may be selected from the group consisting of vinyl, prop-1-enyl, or prop-2-enyl, but-1-enyl, but-2-enyl or but-3-enyl, pent-1-enyl, pent-2-enyl, pent-3-enyl or pent-4-enyl, hex-1-enyl, hex-2-enyl, hex-3-enyl, hex-4-enyl or hex-5-enyl, hept-1-enyl, hept-2-enyl, hept-3-enyl, hept-4-enyl, hept-5-enyl or hept-6-enyl, oct-1-enyl, oct-2-enyl, oct-3-enyl, oct-4-enyl, oct-5-enyl, oct-6-enyl or oct-7-enyl, non-1-enyl, non-2-enyl, non-3-enyl, non-4-enyl, non-5-enyl, non-6-enyl, non-7-enyl, non-8-enyl, dec-1-enyl, dec-2-enyl, dec-3-enyl, dec-4-enyl, dec-5-enyl, dec-6-enyl, dec-7-enyl, dec-8-enyl and dec-9-enyl.

Especially preferred alkenyl groups are C$_2$-C$_7$-1E-alkenyl, C$_4$-C$_7$-3E-alkenyl, C$_5$-C$_7$-4-alkenyl, C$_6$-C$_7$-5-alkenyl and C$_7$-6-alkenyl, in particular C$_2$-C$_7$-1E-alkenyl, C$_4$-C$_7$-3E-alkenyl and C$_5$-C$_7$-4-alkenyl. Examples of particularly preferred alkenyl groups are vinyl, 1E-propenyl, 1E-butenyl, 1E-pentenyl, 1E-hexenyl, 1E-heptenyl, 3-butenyl, 3E-pentenyl, 3E-hexenyl, 3E-heptenyl, 4-pentenyl, 4Z-hexenyl, 4E-hexenyl, 4Z-heptenyl, 5-hexenyl, 6-heptenyl and the like. Alkenyl groups having up to 5 C atoms are generally preferred.

Preferred examples of oxaalkyl, i.e. a corresponding alkyl wherein one non-terminal CH$_2$ group is replaced by —O—, can be straight-chain or branched, preferably straight chain. Specific examples of oxaalkyl may be selected from the group consisting of 2-oxapropyl (═methoxymethyl), 2-(═ethoxymethyl) or 3-oxabutyl (═2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl and 2-, 3-, 4-, 5-, 6-,7-, 8- or 9-oxadecyl.

Preferred examples of carbonyloxy and oxycarbonyl, i.e. a corresponding alkyl wherein one CH$_2$ group is replaced by —O— and one of the thereto adjacent CH$_2$ groups is replaced by —C(O)—. may be selected from the group consisting of acetyloxy, propionyloxy, butyryloxy, pentanoyloxy, hexanoyloxy, acetyloxymethyl, propionyloxymethyl, butyryloxymethyl, pentanoyloxymethyl, 2-acetyloxyethyl, 2-propionyloxyethyl, 2-butyryloxyethyl, 3-acetyloxypropyl, 3-propionyloxypropyl, 4-acetyloxybutyl, methoxycarbonyl, ethoxycarbonyl, propoxycarbonyl, butoxycarbonyl, pentoxycarbonyl, methoxycarbonylmethyl, ethoxy-carbonylmethyl, propoxycarbonylmethyl, butoxycarbonylmethyl, 2-(methoxycarbonyl)ethyl, 2-(ethoxycarbonyl)ethyl, 2-(propoxycarbonyl)ethyl, 3-(methoxycarbonyl)propyl, 3-(ethoxycarbonyl)propyl, and 4-(methoxycarbonyl)-butyl.

Preferred examples of thioalkyl, i.e where one $CH_2$ group is replaced by —S—, may be straight-chain or branched, preferably straight-chain. Suitable examples may be selected from the group consisting of thiomethyl (—$SCH_3$), 1-thioethyl (—$SCH_2CH_3$), 1-thiopropyl (—$SCH_2CH_2CH_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) and 1-(thiododecyl).

A fluoroalkyl group is preferably perfluoroalkyl $C_iF_{2i+1}$, wherein i is an integer from 1 to 15, in particular $CF_3$, $C_2F_5$, $C_3F_7$, $C_4F_9$, $C_5F_{11}$, $C_6F_{13}$, $C_7F_{15}$ or $C_8F_{17}$, very preferably $C_6F_{13}$, or partially fluorinated alkyl, in particular 1,1-difluoroalkyl, all of which are straight-chain or branched.

Alkyl, alkoxy, alkenyl, oxaalkyl, thioalkyl, carbonyl and carbonyloxy groups can be achiral or chiral groups. Particularly preferred chiral groups are 2-butyl (=1-methylpropyl), 2-methylbutyl, 2-methylpentyl, 3-methylpentyl, 2-ethylhexyl, 2-propylpentyl, 2-butyloctyl, 2-hexyldecyl, 2-octyldodecyl, 7-decylnonadecyl, in particular 2-methylbutyl, 2-methylbutoxy, 2-methylpentoxy, 3-methylpentoxy, 2-ethyl-hexoxy, 1-methylhexoxy, 2-octyloxy, 2-oxa-3-methylbutyl, 3-oxa-4-methyl-pentyl, 4-methylhexyl, 2-butyloctyl, 2-hexyldecyl, 2-octyldodecyl, 7-decylnonadecyl, 3,8-dimethyloctyl, 2-hexyl, 2-octyl, 2-nonyl, 2-decyl, 2-dodecyl, 6-meth-oxyoctoxy, 6-methyloctoxy, 6-methyloctanoyloxy, 5-methylheptyloxy-carbonyl, 2-methylbutyryloxy, 3-methylvaleroyloxy, 4-methylhexanoyloxy, 2-chloropropionyloxy, 2-chloro-3-methylbutyryloxy, 2-chloro-4-methyl-valeryl-oxy, 2-chloro-3-methylvaleryloxy, 2-methyl-3-oxapentyl, 2-methyl-3-oxa-hexyl, 1-methoxypropyl-2-oxy, 1-ethoxypropyl-2-oxy, 1-propoxypropyl-2-oxy, 1-butoxypropyl-2-oxy, 2-fluorooctyloxy, 2-fluorodecyloxy, 1,1,1-trifluoro-2-octyloxy, 1,1,1-trifluoro-2-octyl, 2-fluoromethyloctyloxy for example. Most preferred is 2-ethylhexyl.

Preferred achiral branched groups are isopropyl, isobutyl (=methylpropyl), isopentyl (=3-methylbutyl), tert. butyl, isopropoxy, 2-methyl-propoxy and 3-methylbutoxy.

In a preferred embodiment, the organyl groups are independently of each other selected from primary, secondary or tertiary alkyl or alkoxy with 1 to 30 C atoms, wherein one or more H atoms are optionally replaced by F, or aryl, aryloxy, heteroaryl or heteroaryloxy that is optionally alkylated or alkoxylated and has 4 to 30 ring atoms. Very preferred groups of this type are selected from the group consisting of the following formulae

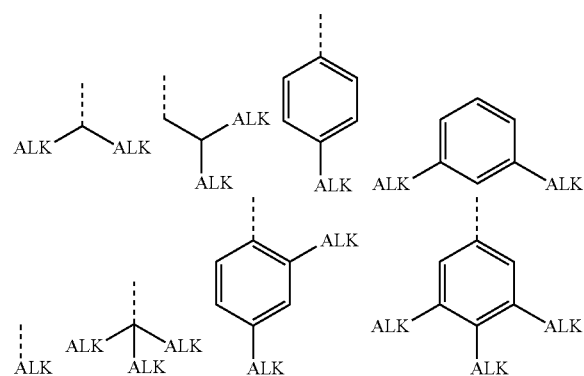

wherein "ALK" denotes optionally fluorinated, preferably linear, alkyl or alkoxy with 1 to 20, preferably 1 to 12 C-atoms, in case of tertiary groups very preferably 1 to 9 C atoms, and the dashed line denotes the link to the ring to which these groups are attached. Especially preferred among these groups are those wherein all ALK subgroups are identical.

Further, in some preferred embodiments in accordance with the present invention, the organic semiconducting materials are polymers or copolymers that encompass one or more repeating units, e.g. M in formula (I), selected from thiophene-2,5-diyl, 3-substituted thiophene-2,5-diyl, optionally substituted thieno[2,3-b]thiophene-2,5-diyl, optionally substituted thieno[3,2-b]thiophene-2,5-diyl, selenophene-2,5-diyl, or 3-substituted selenophene-2,5-diyl.

Preferred examples of organic semiconducting materials comprise one or more monomeric units selected from the group consisting of formulae (A1) to (A83) and one or more monomeric units selected from the group consisting of formulae (D1) to (D142).

Further preferred examples of organic semiconductor materials that can be used in this invention include compounds, oligomers and derivatives of compounds selected from the group consisting of conjugated hydrocarbon polymers such as polyacene, polyphenylene, poly(phenylene vinylene), polyfluorene including oligomers of those conjugated hydrocarbon polymers; condensed aromatic hydrocarbons, such as, tetracene, chrysene, pentacene, pyrene, perylene, coronene, or soluble, substituted derivatives of these; oligomeric para substituted phenylenes such as p-quaterphenyl (p-4P), p-quinquephenyl (p-5P), p-sexiphenyl (p-6P), or soluble substituted derivatives of these; conjugated heterocyclic polymers such as poly(3-substituted thiophene), poly(3,4-bisubstituted thiophene), optionally substituted polythieno[2,3-b]thiophene, optionally substituted polythieno[3,2-b]thiophene, poly(3-substituted selenophene), polybenzothiophene, polyisothianapthene, poly(N-substituted pyrrole), poly(3-substituted pyrrole), poly(3,4-bisubstituted pyrrole), polyfuran, polypyridine, poly-1,3,4-oxadiazoles, polyisothianaphthene, poly(N-substituted aniline), poly(2-substituted aniline), poly(3-substituted aniline), poly(2,3-bisubstituted aniline), polyazulene, polypyrene; pyrazoline compounds; polyselenophene; polybenzofuran; polyindole; polypyridazine; benzidine compounds; stilbene compounds; triazines; substituted metallo- or metal-free porphines, phthalocyanines, fluorophthalocyanines, naphthalocyanines or fluoronaphthalocyanines; $C_{60}$ and $C_{70}$ fullerenes; N,N'-dialkyl, substituted dialkyl, diaryl or substituted diaryl-1,4,5,8-naphthalenetetracarboxylic diimide and fluoro derivatives; N,N'-dialkyl, substituted dialkyl, diaryl or substituted diaryl 3,4,9,10-perylenetetracarboxylicdiimide; bathophenanthroline; diphenoquinones; 1,3,4-oxadiazoles; 11,11,12,12-tetracyanonaptho-2,6-quinodimethane; α,α'-bis(dithieno[3,2-b2',3'-d]thiophene); 2,8-dialkyl, substituted dialkyl, diaryl or substituted diaryl anthradithiophene; 2,2'-bisbenzo[1,2-b:4,5-b']dithiophene. Where a liquid deposition technique of the OSC is desired, compounds from the above list and derivatives thereof are limited to those that are soluble in an appropriate solvent or mixture of appropriate solvents.

Other preferred examples of organic semiconducting materials may be selected from the group consisting of substituted oligoacenes, such as pentacene, tetracene or anthracene, or heterocyclic derivatives thereof. Bis(trialkylsilylethynyl) oligoacenes or bis(trialkylsilylethynyl) heteroacenes, as disclosed for example in U.S. Pat. No. 6,690,029 or WO 2005/055248 A1 or U.S. Pat. No. 7,385,221, are also useful.

Further preferred organic semiconducting materials are selected from the group consisting of small molecules or monomers of the tetra-heteroaryl indacenodithiophene-based structural unit as disclosed in WO 2016/015804 A1, and polymers or copolymers comprising one or more repeating units thereof.

Also preferred organic semiconducting materials may be selected from the group of small molecules or monomers or polymers comprising a 2,7-(9,9')spirobifluorene moiety, optionally substituted and preferably substituted with amino groups. Such spirobifluorenes are, for example, disclosed in WO 97/39045. Examples of spirobifluorenes suitable for use as monomeric unit M of formula (V) may be selected from the group consisting of formulae (VI-1) to (VI-7)

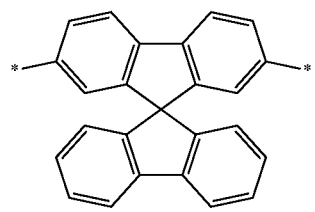

(VI-1)

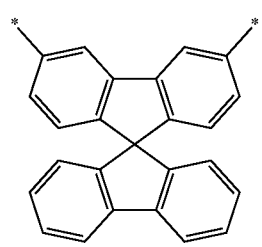

(VI-2)

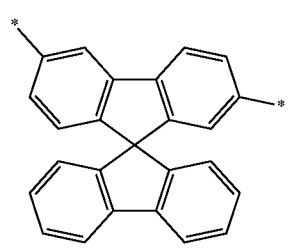

(VI-3)

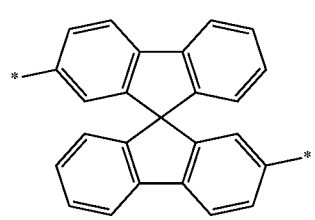

(VI-4)

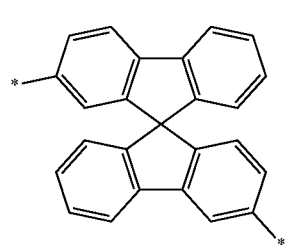

(VI-5)

-continued

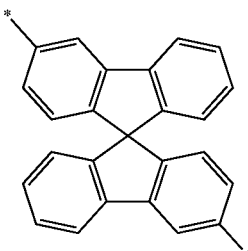

(VI-6)

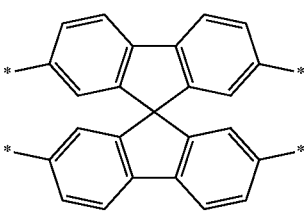

(VI-7)

wherein each of the hydrogen atoms may independently of any other be as defined herein in respect to $R^{101}$ and each asterisk "*" independently may denote a bond to neighboring moiety (for example in a polymer) or may denote a bond to a group as defined above for $R^{101}$ (for example in a compound of formula (V-a) or (V-b)). In respect to formulae (VI-1) to (VI-7) preferred substituents, including the ones for "*", may be selected from the group consisting of alkyl having from 1 to 20 carbon atoms; aryl having from 6 to 20 carbon atoms, said aryl being optionally substituted with alkyl or alkoxy having from 1 to 20, preferably 1 to 10 carbon atoms; and $NR^{110}R^{111}$ with $R^{110}$ and $R^{111}$ being independently of each other selected from the group consisting of alkyl having from 1 to 20 carbon atoms, aryl having from 6 to 20 carbon atoms, said aryl being optionally substituted with alkyl or alkoxy having from 1 to 20, preferably 1 to 10 carbon atoms, most preferably R110 and R111 being independently of each other selected from methyl, ethyl, n-propyl, iso-propyl, n-butyl, iso-butyl, tert-butyl, pentyl, methoxy, ethoxy, n-propoxy, iso-propoxy n-butoxy, iso-butoxy, tert-butoxy and pentoxy.

Particularly preferred examples of organic semiconducting materials are OSC-1, OSC-2, OSC-3 and OSC-4, the formulae of which are given in the examples.

In a one aspect the present semiconducting material may, for example, be a small molecule, i.e. a compound comprising one (i.e. m=1) structural unit of formula (V) and two inert chemical groups $R^a$ and $R^b$. Such a small molecule may for example be represented by formula (I-a)

$$R^a\text{-M-}R^b \quad \quad \quad \text{(V-a)}$$

wherein M is as defined herein and $R^a$ and $R^b$ are inert chemical groups. Such inert chemical groups $R^a$ and $R^b$ may independently of each other be selected from the group consisting of hydrogen, fluorine, alkyl having from 1 to 10 carbon atoms, alkyl having from 1 to 10 carbon atoms wherein one or more, for example all, hydrogen has been replaced with fluorine, aromatic ring systems of from 5 to 30 carbon atoms and aromatic ring systems of from 5 to 30 carbon atoms wherein one or more hydrogen atom may independently of any other be replaced by fluorine or alkyl having from 1 to 10 carbon atoms.

Further preferred p-type OSCs are copolymers comprising electron acceptor and electron donor units. Preferred copolymers of this preferred embodiment are for example copolymers comprising one or more benzo[1,2-b:4,5-b']dithiophene-2,5-diyl units that are preferably 4,8-disubstituted by one or more groups R as defined above, and further comprising one or more aryl or heteroaryl units selected from Group A and Group B, preferably comprising at least one unit of Group A and at least one unit of Group B, wherein Group A consists of aryl or heteroaryl groups having electron donor properties and Group B consists of aryl or heteroaryl groups having electron acceptor properties, and preferably Group A consists of selenophene-2,5-diyl, thiophene-2,5-diyl, thieno[3,2-b]thiophene-2,5-diyl, thieno[2,3-b]thiophene-2,5-diyl, selenopheno[3,2-b]selenophene-2,5-diyl, selenopheno[2,3-b]selenophene-2,5-diyl, selenopheno[3,2-b]thiophene-2,5-diyl, selenopheno[2,3-b]thiophene-2,5-diyl, benzo[1,2-b:4,5-b']dithiophene-2,6-diyl, 2,2-dithiophene, 2,2-diselenophene, dithieno[3,2-b:2',3'-d]silole-5,5-diyl, 4H-cyclopenta[2,1-b:3,4-b']dithiophene-2,6-diyl, 2,7-di-thien-2-yl-carbazole, 2,7-di-thien-2-yl-fluorene, indaceno[1,2-b:5,6-b']dithiophene-2,7-diyl, benzo[1",2":4,5;4",5":4',5']bis(silolo[3,2-b:3',2'-b']thiophene)-2,7-diyl, 2,7-di-thien-2-yl-indaceno[1,2-b:5,6-b']dithiophene, 2,7-di-thien-2-yl-benzo[1",2":4,5;4",5":4',5']bis(silolo[3,2-b:3',2'-b']thiophene)-2,7-diyl, and 2,7-di-thien-2-yl-phenanthro[1,10,9,8-c,d,e,f,g]carbazole, all of which are optionally substituted by one or more, preferably one or two groups R as defined above, and Group B consists of benzo[2,1,3]thiadiazole-4,7-diyl, 5,6-dialkyl-benzo[2,1,3]thiadiazole-4,7-diyl, 5,6-dialkoxybenzo[2,1,3]thiadiazole-4,7-diyl, benzo[2,1,3]selenadiazole-4,7-diyl, 5,6-dialkoxy-benzo[2,1,3]selenadiazole-4,7-diyl, benzo[1,2,5]thiadiazole-4,7,diyl, benzo[1,2,5]selenadiazole-4,7,diyl, benzo[2,1,3]oxadiazole-4,7-diyl, 5,6-dialkoxy-benzo[2,1,3]oxadiazole-4,7-diyl, 2H-benzotriazole-4,7-diyl, 2,3-dicyano-1,4-phenylene, 2,5-dicyano,1,4-phenylene, 2,3-difluro-1,4-phenylene, 2,5-difluoro-1,4-phenylene, 2,3,5,6-tetrafluoro-1,4-phenylene, 3,4-difluorothiophene-2,5-diyl, thieno[3,4-b]pyrazine-2,5-diyl, quinoxaline-5,8-diyl, thieno[3,4-b]thiophene-4,6-diyl, thieno[3,4-b]thiophene-6,4-diyl, and 3,6-pyrrolo[3,4-c]pyrrole-1,4-dione, all of which are optionally substituted by one or more, preferably one or two groups R as defined above.

In other preferred embodiments of the present invention, the OSC materials are substituted oligoacenes such as pentacene, tetracene or anthracene, or heterocyclic derivatives thereof. Bis(trialkylsilylethynyl) oligoacenes or bis(trialkylsilylethynyl) heteroacenes, as disclosed for example in U.S. Pat. No. 6,690,029 or WO 2005/055248 A1 or U.S. Pat. No. 7,385,221, are also useful.

Further preferred organic semiconducting materials are selected from the group consisting of small molecules or monomers of the tetra-heteroaryl indacenodithiophene-based structural unit as disclosed in WO 2016/015804 A1, and polymers or copolymers comprising one or more repeating units thereof, such as, for example, one of the following polymers (P-1) to (P-3):

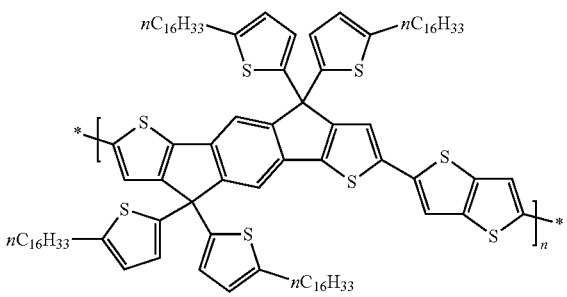

(P-1)

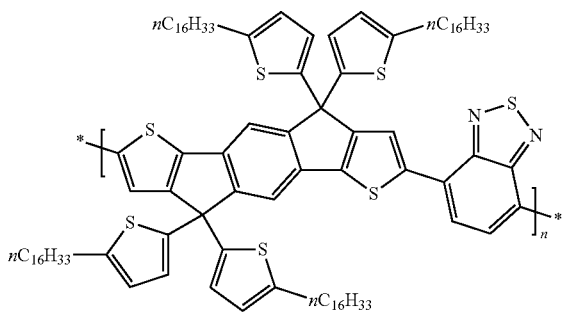

(P-2)

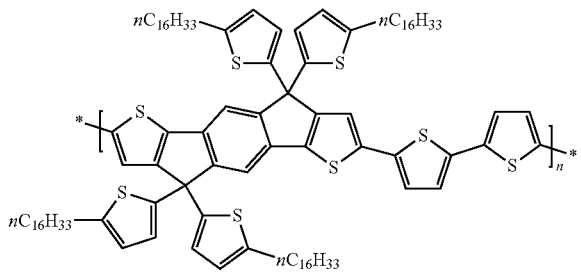

(P-3)

Depending upon the intended application the present organic semiconducting material may also comprise other components, such as, for example, a fullerene or modified fullerene, the ratio polymer:fullerene is preferably from 5:1 to 1:5 by weight, more preferably from 1:1 to 1:3 by weight, most preferably 1:1 to 1:2 by weight. Suitable fullerenes may, for example, be indene-$C_{60}$-fullerene bisadduct like ICBA, or a (6,6)-phenyl-butyric acid methyl ester derivatized methano $C_{60}$ fullerene, also known as "PCBM-$C_{60}$" or "$C_{60}$PCBM", as disclosed for example in G. Yu, J. Gao, J. C. Hummelen, F. Wudl, A. J. Heeger, Science 1995, Vol. 270, p. 1789 ff and having the structure shown below, or structural analogous compounds with e.g. a $C_{61}$ fullerene group, a $C_{70}$ fullerene group, or a $C_{71}$ fullerene group, or an organic polymer (see for example Coakley, K. M. and McGehee, M. D. Chem. Mater. 2004, 16, 4533).

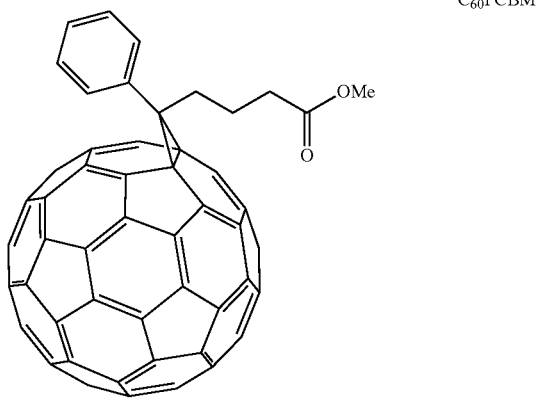

C$_{60}$PCBM

Such organic semiconducting materials may be purchased from commercial sources, such as SigmaAldrich or Merck KGaA (Darmstadt, Germany), or may be synthesized according to published syntheses.

In a further aspect the present semiconducting material may be an oligomer or a polymer as defined above. Such oligomers and polymers may be synthesized according to or in analogy to methods that are known to the skilled person and are described in the literature from monomers as described in the following.

Monomers that are suitable for the synthesis of the present oligomers and polymers may be selected from compounds comprising a structural unit of formula (I) and at least one reactive chemical group R$^c$ which may be selected from the group consisting of Cl, Br, I, O-tosylate, O-triflate, O-mesylate, O-nonaflate, —SiMe$_2$F, —SiMeF$_2$, —O—SO$_2$Z$^1$, —B(OZ$^2$)$_2$, —CZ$^3$=C(Z$^3$)$_2$, —C≡CH, —C≡CSi(Z$^1$)$_3$, —ZnX$^{00}$ and —Sn(Z$^4$)$_3$, preferably —B(OZ$^2$)$_2$ or —Sn(Z$^4$)$_3$, wherein X$^{00}$ is as defined herein, and Z$^1$, Z$^2$, Z$^3$ and Z$^4$ are selected from the group consisting of alkyl and aryl, preferably alkyl having from 1 to 10 carbon atoms, each being optionally substituted with R$^0$ as defined herein, and two groups Z$^2$ may also together form a cyclic group. Alternatively such a monomer may comprise two reactive chemical groups and is, for example, represented by formula (V-b)

R$^c$-M-R$^d$ (V-b)

wherein M is as defined herein and R$^c$ and R$^d$ are reactive chemical groups as defined above in respect to R$^c$. Such monomers may generally be prepared according to methods well known to the person skilled in the art.

X$^{00}$ is halogen. Preferably X$^{00}$ is selected from the group consisting of F, Cl and Br. Most preferably X$^{00}$ is Br.

Preferred aryl-aryl coupling and polymerisation methods used in the processes described herein may, for example, be one or more of Yamamoto coupling, Kumada coupling, Negishi coupling, Suzuki coupling, Stille coupling, Sonogashira coupling, Heck coupling, C—H activation coupling, Ullmann coupling and Buchwald coupling. Especially preferred are Suzuki coupling, Negishi coupling, Stille coupling and Yamamoto coupling. Suzuki coupling is described for example in WO 00/53656 A1. Negishi coupling is described for example in *J. Chem. Soc., Chem. Commun.*, 1977, 683-684. Yamamoto coupling is described for example in T. Yamamoto et al., *Prog. Polym. Sci.*, 1993, 17, 1153-1205, or WO 2004/022626 A1, and Stille coupling is described for example in Z. Bao et al., *J. Am. Chem. Soc.*, 1995, 117, 12426-12435. For example, when using Yamamoto coupling, monomers having two reactive halide groups are preferably used. When using Suzuki coupling, compounds of formula (I-b) having two reactive boronic acid or boronic acid ester groups or two reactive halide groups are preferably used. When using Stille coupling, monomers having two reactive stannane groups or two reactive halide groups are preferably used. When using Negishi coupling, monomers having two reactive organozinc groups or two reactive halide groups are preferably used.

Preferred catalysts, especially for Suzuki, Negishi or Stille coupling, are selected from Pd(0) complexes or Pd(II) salts. Preferred Pd(0) complexes are those bearing at least one phosphine ligand, for example Pd(Ph$_3$P)$_4$. Another preferred phosphine ligand is tris(ortho-tolyl)phosphine, for example Pd(o-Tol$_3$P)$_4$. Preferred Pd(II) salts include palladium acetate, for example Pd(OAc)$_2$. Alternatively the Pd(0) complex can be prepared by mixing a Pd(0) dibenzylideneacetone complex, for example tris(dibenzyl-ideneacetone) dipalladium(0), bis(dibenzylideneacetone)-palladium(0), or Pd(II) salts e.g. palladium acetate, with a phosphine ligand, for example triphenylphosphine, tris(ortho-tolyl)phosphine or tri(tert-butyl)phosphine. Suzuki polymerisation is performed in the presence of a base, for example sodium carbonate, potassium carbonate, lithium hydroxide, potassium phosphate or an organic base such as tetraethylammonium carbonate or tetraethylammonium hydroxide. Yamamoto polymerisation employs a Ni(0) complex, for example bis(1,5-cyclooctadienyl)nickel(0).

Suzuki and Stille polymerisation may be used to prepare homopolymers as well as statistical, alternating and block random copolymers. Statistical or block copolymers can be prepared for example from the above monomers of formula (I-b), wherein one of the reactive groups is halogen and the other reactive group is a boronic acid, boronic acid derivative group or alkylstannane. The synthesis of statistical, alternating and block copolymers is described in detail for example in WO 03/048225 A2 or WO 2005/014688 A2.

As alternatives to halogens as described above, leaving groups of formula —O—SO$_2$Z$^1$ can be used wherein Z$^1$ is as described above. Particular examples of such leaving groups are tosylate, mesylate and triflate.

Binder

Where appropriate and needed, for example, to adjust the rheological properties as described for example in WO 2005/055248 A1, some embodiments of the present invention employ organic semiconducting compositions that include one or more organic binders.

The binder, which is typically a polymer, may comprise either an insulating binder or a semiconducting binder, or mixtures thereof may be referred to herein as the organic binder, the polymeric binder, or simply the binder.

Preferred binders according to the present invention are materials of low permittivity, that is, those having a permittivity s of 3.3 or less. The organic binder preferably has a permittivity s of 3.0 or less, more preferably 2.9 or less. Preferably the organic binder has a permittivity s of 1.7 or more. It is especially preferred that the permittivity of the binder is in the range from 2.0 to 2.9. Whilst not wishing to be bound by any particular theory it is believed that the use of binders with a permittivity s of greater than 3.3, may lead to a reduction in the OSC layer mobility in an electronic device, for example an OFET. In addition, high permittivity binders could also result in increased current hysteresis of the device, which is undesirable.

Examples of suitable organic binders include polystyrene, or polymers or copolymers of styrene and α-methyl styrene; or copolymers including styrene, a-methylstyrene and butadiene may suitably be used. Further examples of suitable binders are disclosed for example in US 2007/0102696 A1.

In one type of preferred embodiment, the organic binder is one in which at least 95%, more preferably at least 98% and especially all of the atoms consist of hydrogen, fluorine and carbon atoms.

The binder is preferably capable of forming a film, more preferably a flexible film.

The binder can also be selected from crosslinkable binders such as acrylates, epoxies, vinylethers, and thiolenes, preferably having a sufficiently low permittivity, very preferably of 3.3 or less. The binder can also be mesogenic or liquid crystalline.

In another preferred embodiment the binder is a semiconducting binder, which contains conjugated bonds, especially conjugated double bonds and/or aromatic rings. Suitable and preferred binders are for example polytriarylamines as disclosed for example in U.S. Pat. No. 6,630,566.

The proportions of binder to OSC is typically 20:1 to 1:20 by weight, preferably 10:1 to 1:10 more preferably 5:1 to 1:5, still more preferably 3:1 to 1:3 further preferably 2:1 to 1:2 and especially 1:1. Dilution of the compound of formula I in the binder has been found to have little or no detrimental effect on the charge mobility, in contrast to what would have been expected from the prior art.

Substrate and Charge Transfer Layers

The present organic electronic device may optionally comprise one or more substrate. Such substrate is not particularly limited and may be any suitable material that is inert under use conditions. Examples of such materials are glass and polymeric materials. Preferred polymeric material include but are not limited to alkyd resins, allyl esters, benzocyclobutenes, butadiene-styrene, cellulose, cellulose acetate, epoxide, epoxy polymers, ethylene-chlorotrifluoro ethylene copolymers, ethylene-tetra-fluoroethylene copolymers, fiber glass enhanced polymers, fluorocarbon polymers, hexafluoropropylenevinylidene-fluoride copolymer, high density polyethylene, parylene, polyamide, polyimide, polyaramid, polydimethylsiloxane, polyethersulphone, polyethylene, polyethylenenaphthalate, polyethyleneterephthalate, polyketone, polymethylmethacrylate, polypropylene, polystyrene, polysulphone, polytetrafluoroethylene, polyurethanes, polyvinylchloride, polycycloolefin, silicone rubbers, and silicones. Of these polyethyleneterephthalate, polyimide, polycycloolefin and polyethylenenaphthalate materials are more preferred. Additionally, for some embodiments of the present invention the substrate can be any suitable material, for example a polymeric material, metal or glass material coated with one or more of the above listed materials or coated with one or more metal, such as for example titanium. It will be understood that in forming such a substrate, methods such as extruding, stretching, rubbing or photochemical techniques can be employed to provide a homogeneous surface for device fabrication as well as to provide pre-alignment of an organic semiconductor material in order to enhance carrier mobility therein. Alternatively, the substrate can be a polymeric material, metal or glass coated with one or more of the above polymeric materials.

A suitable substrate may, for example, be transparent or semi-transparent. A suitable substrate may, for example, also be flexible or non-flexible.

Said substrate may, for example, serve as support and preferably be adjacent to a first electrode layer and opposite the second electrode layer.

Additionally the present organic electronic device may optionally comprise further layers acting as charge transport layers. Exemplary charge transport layers may act as hole transporting layer and/or electron blocking layer, or electron transporting layer and/or hole blocking layer. Generally—if present—such layers are between the electrodes and the organic semiconducting layer.

Suitable materials for a hole transporting and/or electron blocking layer may be selected from the group consisting of metal oxides, like for example, ZTO, $MoO_x$, $NiO_x$, a conjugated polymer electrolyte, like for example PEDOT:PSS, a conjugated polymer, like for example polytriarylamine (PTAA), an organic compound, like for example N,N'-diphenyl-N,N'-bis(1-naphthyl)(1,1'-biphenyl)-4,4'diamine (NPB), N,N'-diphenyl-N,N'-(3-methylphenyl)-1,1'-biphenyl-4,4'-diamine (TPD).

Suitable materials for a hole blocking and/or electron transporting layer may be selected from the group consisting of metal oxides, like for example, $ZnO_x$, $TiO_x$, a salt, like for example LiF, NaF, CsF, a conjugated polymer electrolyte, like for example poly[3-(6-trimethylammoniumhexyl)thiophene], poly(9,9-bis(2-ethylhexyl)-fluorene]-b-poly[3-(6-trimethylammoniumhexyl)thiophene], or poly[(9,9-bis(3'—(N,N-dimethyl-amino)propyl)-2,7-fluorene)-alt-2,7-(9,9-dioctyl-fluorene)] or an organic compound, like for example tris(8-quinolinolato)-aluminium(III) ($Alq_3$), 4,7-diphenyl-1,10-phenanthroline.

Organic Electronic Device

The present organic electronic device may, for example, be selected from the group consisting of organic field effect transistors (OFET), organic thin film transistors (OTFT), organic light emitting diodes (OLED), organic light emitting transistors (OLET), organic photovoltaic devices (OPV), organic photodetectors (OPD), organic solar cells, laser diodes, Schottky diodes, photoconductors and photodetectors. Preferably the present organic electronic device is an organic field effect transistor (PFET) or an organic thin film transistor (OTFT).

A preferred example of the present organic electronic device is an organic field effect transistor, preferably comprising a gate electrode, a source electrode, a drain electrode, an insulating layer (preferably a gate insulating layer), and an organic semiconducting layer. Optionally an organic field effect transistor may also comprise one or more selected from the group consisting of substrate and charge transport layer. These layers in the OFET device may be arranged in any sequence, provided that the source electrode and the drain electrode are separated from the gate electrode by the insulating layer, the gate electrode and the semiconductor layer both contact the insulating layer, and the source electrode and the drain electrode both contact the semiconducting layer.

The OFET device according to the present invention can be a top gate device or a bottom gate device. Suitable structures of an OFET device are known to the skilled person and are described in the literature, for example in US 2007/0102696 A1.

FIG. 1 shows a schematic representation of a typical top gate OFET according to the present invention, including source (S) and drain (D) electrodes (2) provided on a substrate (1), a self-assembled monolayer (3) of a moiety of general formula (I) of the present invention provided on the S/D electrodes, a layer of organic semiconducting material (4) provided on the S/D electrodes and the self-assembled monolayer (3), a layer of dielectric material (5) as gate insulator layer provided on the organic semiconducting layer (4), a gate electrode (6) provided on the gate insulator layer (5), and an optional passivation or protection layer (7) provided on the gate electrode (6) to shield it from further layers or devices that may be provided later or to protect it from environmental influence. The area between the source and drain electrodes (2), indicated by the double arrow, is the channel area.

Figure 2:
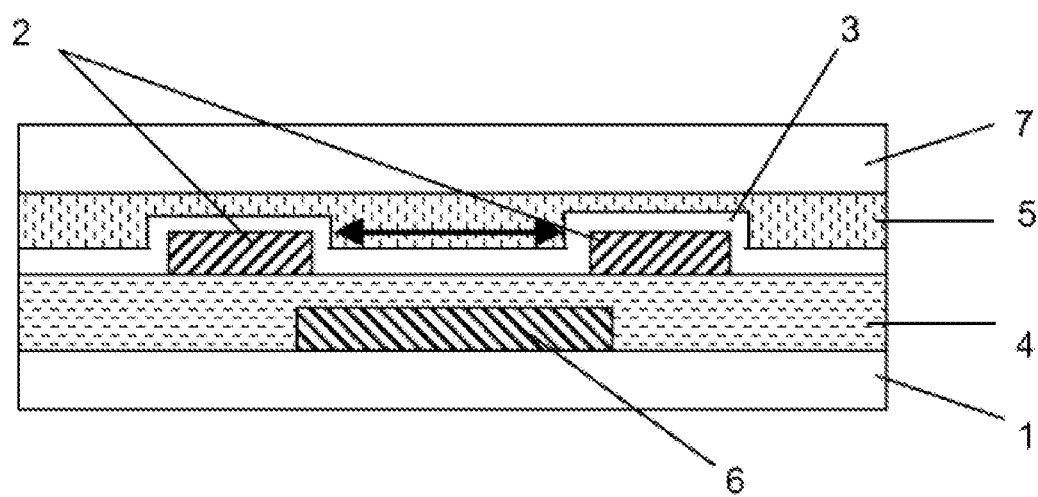
FIG. 2 shows a schematic representation of an exemplary bottom gate OFET in accordance with the present application.

FIG. 2 shows a schematic representation of a typical bottom gate-bottom contact OFET according to the present invention, including a gate electrode (6) provided on a substrate (1), a layer of dielectric material (5) (gate insulator layer) provided on the gate electrode (4), source (S) and drain (D) electrodes (2) provided on the gate insulator layer (6), a self-assembled monolayer (3) of a moiety of general formula (I) of the present invention provided on the S/D electrodes, a layer of an organic semiconducting material (4) provided on the S/D electrodes and the self-assembled monolayer (3), and an optional protection or passivation layer (7) provided on the organic semiconducting layer (4) to shield it from further layers or devices that may be later provided or protect it from environmental influences.

In an OFET device according to the present invention, the dielectric material for the gate insulator layer is preferably an organic material. Especially preferred are organic dielectric materials having a dielectric constant from 1.0 to 5.0, very preferably from 1.8 to 4.0 ("low k materials"), as disclosed for example in US 2007/0102696 A1 or U.S. Pat. No. 7,095,044.

The present transistor device may also be a complementary organic thin film transistor (CTFT) comprising a layer of a p-type semiconductor material as well as a layer of an n-type semiconductor material.

Device Production

Generally stated, the present application also relates to a method for producing the present organic electronic device, said method comprising the steps of
(a) providing one or more first electrode layer as defined herein, optionally on a substrate as defined herein;
(b) depositing onto said first electrode layer a second electrode layer as defined herein, to obtain one or more electrode; and
(c) depositing onto said electrode an organic semiconducting material to obtain an organic semiconducting layer.

Preferably, the process for producing the present organic electronic device may further comprise the step of depositing a third electrode layer as defined herein onto said second electrode layer. Thus, preferably the method of producing the present organic electronic device comprises the steps of
(a) providing one or more first electrode layer as defined herein, optionally on a substrate as defined herein;
(b) depositing onto said first electrode layer a second electrode layer as defined herein, and (b') depositing onto said second electrode layer a third electrode layer as defined herein, to obtain one or more electrode; and
(c) depositing onto said one or more electrode an organic semiconducting material to obtain and organic semiconducting layer.

In step (a), one or more electrode layer as defined herein is provided, optionally on a substrate as defined herein. It may, for example, be necessary to provide in total two first (separate) electrode layers so as to be able to make the source electrode and the drain electrode of an organic electronic device as defined herein. The first electrode layer may be produced by conventional methods well known to the skilled person, such as, for example, by vapor deposition methods.

In step (b), the second electrode layer is preferably deposited by an electroless plating process or an ion exchange process. Such processes may, for example, be performed by contacting the first electrode layer in a bath, preferably a metal ion exchange bath, with ions of the second metal, with the second metal as defined herein. This will lead to the deposition and finally to the covering of the first electrode layer with the second electrode layer.

The ions of the second metal may be introduced into the bath in form of the respective salts, for example, gold salts such as gold cyanide (AuCN) or potassium gold cyanide (KAu(CN)$_2$), palladium salts such as palladium(II) chloride (PdCl$_2$), platinum salts such as potassium tetrachloroplatinate(II) (K$_2$PtCl$_4$), or silver salts such as silver nitrate (AgNO$_3$), silver acetate (CH$_3$COOAg), silver triflate (also referred to as "silver trifluoromethanesulfonate", CF$_3$SO$_3$Ag), silver tosylate (also referred to as "silver p-toluenesulfonate, H$_3$CC$_6$H$_4$SO$_3$Ag), or silver cyanide (AgCN), to only name a few non-limiting examples.

Said bath is preferably a solution, for example, an aqueous solution or an organic solution, preferably an aqueous solution. Other example of a suitable solvent are acetic acid and acetone.

The concentration of the ions of the second metal in the bath may be from 0.0001 mmol l$^{-1}$ to 0.1 mol l$^{-1}$, and is preferably at least 0.001 mol l$^{-1}$ or 0.01 mol l$^{-1}$ or 0.1 mol l$^{-1}$ or 0.5 mol l$^{-1}$. For an aqueous solution the concentration of the ions of the second metal in the bath is preferably at most 1 mmol l$^{-1}$.

The temperature of the bath is not particularly limited and may, for example, be in the range from −30° C. to 100° C., depending upon optimum conditions.

The contact time may be varied according to the needs and may, for example, range from 5 s to 5 min, and preferably is in the range from 5 s to 1 min.

Preferably, said bath does not comprise any reducing agent for the ions of the second metal.

Preferably, said bath comprises one or more additives selected from the group consisting of ion complexing agents, buffering agents, stabilizers, salts, acids and bases. Acids and bases (e.g. alkali) are particularly preferred as their presence is—without wishing to be bound by theory—believed to accelerate the deposition.

Following the deposition of the second electrode layer preferably a washing step or a drying step or both are performed.

Step (b'), i.e. the deposition of the third electrode layer, is optional, i.e. step (b') may be present or absent. Preferably, step (b') is present.

In step (b'), the third electrode layer may be prepared by applying to the second electrode layer a compound (in the following referred to as "SAM precursor compound") comprising at each occurrence independently any moiety selected from the group consisting of formulae (I), (II), (III) and any of their respective subformulae as defined herein. Preferably, said SAM precursor compound is selected from the group consisting of
(A) the following formulae (I'), (I")

and the respective subformulae, with R$^1$, Sp, a and X$^1$ as defined herein;
(B) any compound of formula (II) and the respective subformulae, wherein R$^{11}$ and/or—if present—R$^{16}$ comprises -(Sp)$_a$-X$^1$—H; and
(C) any compound of formula (III) and the respective subformulae, wherein in any group —X$^1$—*—if present—the symbol "*" denotes H.

It is noted that steps (b) and (b') may also be performed as a single step. In this case, the metal ion exchange bath also comprises one or more SAM precursor compound as defined herein. It is, however, preferred that steps (b) and (b') are preformed as separate steps.

Following the deposition of the self-assembled monolayer, preferably a washing step or a drying step or both are performed.

In step (c), if the electrodes are the source electrode and the drain electrode then the organic semiconducting material is deposited between these two (into what is generally referred to as "channel area" or simply "channel") and optionally also on top of the two electrodes.

For the organic electronic device being a top gate OFET, following step (c), said process may additionally comprise the following steps, preferably in such sequence, of (d) depositing as gate insulator layer a dielectric material as defined herein onto the organic semiconducting layer;
(e) depositing a gate electrode onto the gate insulator layer; and
(f) optionally depositing a passivation layer onto the gate electrode.

For the organic electronic device being a bottom gate OFET, before step (a), the process may further comprise the steps of (o) depositing a gate electrode onto a substrate; and
(o') depositing as gate insulator layer a dielectric material onto the gate electrode; and optionally, following step (d), the process may further comprise the following step (d) depositing a passivation layer onto the organic semiconducting layer.

Further layers may be deposited by standard methods, which are well known in the industry. Liquid coating of devices is more desirable than vacuum deposition techniques. Solution deposition methods are especially preferred. Preferred deposition techniques include, without limitation, dip coating, spin coating, inkjet printing, nozzle printing, letter-press printing, screen printing, gravure printing, doctor blade coating, roller printing, reverse-roller printing, offset lithography printing, dry offset lithography printing, flexographic printing, web printing, spray coating, curtain coating, brush coating, slot dye coating or pad printing.

Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other non-limiting examples of suitable fluoropolymers and fluorosolvents are known in prior art, like for example the perfluoropolymers Teflon AF® 1600 or 2400 (from DuPont) or Fluoropel® (from Cytonix) or the perfluorosolvent FC 43® (Acros, No. 12377).

EXAMPLES

If not otherwise mentioned all solvents, salts, organic semiconducting materials etc. were obtained from commercial sources, such as for example SigmaAldrich or Merck KGaA, Darmstadt, Germany.

The electrical characterization of the transistor devices was carried out in ambient air atmosphere using computer controlled Agilent 4155C Semiconductor Parameter Analyser. Charge carrier mobility in the saturation regime ($\mu_{sat}$) was calculated for the compound. Field-effect mobility was calculated in the saturation regime ($V_d > (V_g - V_0)$) using equation (eq. 1):

$$\left(\frac{dI_d^{sat}}{dV_g}\right)_{V_d} = \frac{WC_i}{L}\mu^{sat}(V_g - V_0) \quad\quad (eq.\ 1)$$

where W is the channel width, L the channel length, $C_i$ the capacitance of insulating layer, $V_g$ the gate voltage, $V_0$ the turn-on voltage, and $\mu_{sat}$ is the charge carrier mobility in the saturation regime. Turn-on voltage ($V_0$) was determined as the onset of source-drain current.

Example 1—Preparation of Ag+-Solution 17 mg of $AgNO_3$ were dissolved in 10 ml of acetone or acetic acid. The solution was left overnight so that the $AgNO_3$ could completely dissolve. The resulting solution has a concentration of $Ag^+$-ions of 10 mmol $l^{-1}$.

Example 2—Device Preparation

Molybdenum electrodes on a substrate (i.e. molybdenum as first electrode layer) were placed into a spin coater. The solution of $Ag^+$ in acetic acid prepared in Example 1 was puddled on and left for 2 minutes, thereby forming the second electrode layer. Excess solution was spun off, followed by rinsing with iso-propanol. The substrate with first and second electrode layer was allowed to dry before being placed in a second spin coater and brought into contact for one minute with a solution of an aryl thiol substituted with electron withdrawing groups, thereby forming the third electrode layer. Excess solution was spun off, followed by rinsing with iso-propanol. Onto the resulting electrode with first, second and third electrode layers was then deposited a layer of an organic semiconducting material.

Performance for so-obtained devices in accordance with the present application was assessed. The results showed good reproducibility between the various devices prepared according to this method. Further, the devices showed high mobility as well as good ratios between Ion and Ioff.

Comparative devices were prepared with the second electrode layer, i.e. without contacting a solution of $Ag^+$-ions. Performance for the resulting devices was assessed. The results indicated extremely high variability in the performance from one device to the next as well as some very bad mobilities. In fact, a significant number of devices was found to not work at all.

Example 3—Work Functions

Work functions were determined using a Kelvin Probe for the molybdenum substrates (denoted "Single layer electrode" in Table 1) as well as for the electrode obtained in Example 2, said electrode comprising first, second and third electrode layers (denoted "Multi-layer electrode" in Table 1). The respective results are indicated in Table 1.

TABLE 1

| Sample | Work function [eV] |
| --- | --- |
| Single-layer electrode | 4.7 |
| Multi-layer electrode | 5.0 to 5.3 |

Thus, generally stated the present results clearly show that the organic electronic devices and the respective method of production in accordance with the present application are well suited for commercial production. The present application allows for the production of organic electronic devices with significantly reduced variability from one device to the next while at the same time allowing for a high level of device performance.

Very surprisingly, the present inventors have noted that the present process for the deposition of silver as the second electrode layer did not lead to the formation of dendrites. This makes for more reliable devices and greatly facilitates their production.

The invention claimed is:

1. Organic electronic device comprising
one or more electrodes comprising a first electrode layer and a second electrode layer; and
an organic semiconducting layer,
wherein said first electrode layer comprises a first metal, said first metal being selected from the group consisting of chromium, molybdenum, tungsten and any blend of any of these; and wherein said second electrode layer comprises a second metal, said second metal being selected from the group consisting of any metal or blend of metals suitable for electroless plating onto said first metal; and
said second electrode layer covers said first electrode layer through direct physical contact wherein no more than 20% of a surface of said first electrode layer is in direct physical contact with said organic semiconducting layer.

2. Organic electronic device according to claim 1, wherein the second metal is selected from the group consisting of silver, metals having a work function Φ of at least 4.9 eV, and any blend of any of these.

3. Organic electronic device according to claim 1, wherein the second metal is selected from the group consisting of silver, cobalt, rhodium, iridium, nickel, palladium, platinum, gold, and any blend of any of these; preferably is selected from the group consisting of silver, cobalt, iridium, nickel, palladium, platinum, gold, and any blend of any of these; more preferably is selected from the group consisting of silver, iridium, nickel, palladium, platinum, gold, and any blend of any of these; even more preferably is selected from the group consisting of silver, palladium, platinum, gold, and any blend comprising such metal.

4. Organic electronic device according to claim 1, wherein the second metal is silver.

5. Organic electronic device according to claim 1, wherein said one or more electrodes comprises a third electrode layer, said third electrode layer being a self-assembled monolayer,
wherein said third electrode layer covers said second electrode layer through direct physical contact wherein no more than 20% of a surface of said second electrode layer is in direct physical contact with said organic semiconducting layer.

6. Organic electronic device according to claim 1, wherein said one or more electrodes comprises a third electrode layer, said third electrode layer being a self-assembled monolayer consisting of moieties selected from the group consisting of the following moieties of formulae (I) to (III)

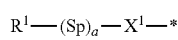
(I)

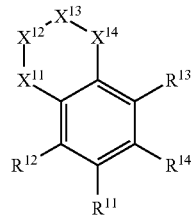
(II)

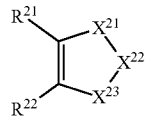
(III)

wherein
$X^1$ is at each occurrence independently selected from the group consisting of $-X^a-$, $-X^a-X^b-$, $-C(=X^a)-X^b-$, $-X^aO_3-$, $-X^a-X^bO_3-$, $-PO_2H-$, and $-PO_3H-$;
$X^a$ and $X^b$ are at each occurrence independently S or Se;
a is 0 or 1;
Sp is at each occurrence independently a group of formula (IV)

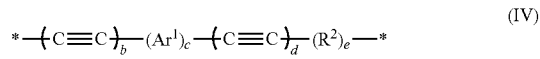
(IV)

b, c, d and e are at each occurrence independently 0, 1 or 2, with the provision that if a is 1, then the sum of b, c, d and e is at least 1;
$Ar^1$ is para-phenylene, or para-phenylene wherein one or more carbon ring atom is substituted by N;
$R^2$ is at each occurrence independently selected from the group consisting of $-CH_2-$, $-CHF-$, and $-CF_2-$;
$R^1$ is at each occurrence independently an organyl group or an organoheteryl group;
$X^{11}$ is selected from the group consisting of $-CH_2-$, $-CF_2-$ and aromatic $C-R^{15}$;
$X^{12}$ is selected from the group consisting of $-CH_2-$, $-CF_2-$ and $-C(=O)-$;
$X^{13}$ is selected from the group consisting of $-CH_2-$, $-CF_2-$ and $N-R^{16}$;
$X^{14}$ is selected from the group consisting of $-CH_2-$, $-CF_2-$, $-C(=O)-$ and $N-R^{17}$;
provided that either $X^{13}$ is $N-R^{16}$ or $X^{14}$ is $N-R^{17}$;
$R^{11}$ and—if present—$R^{16}$ are independently of each other selected from the group consisting of H, F, methyl, ethyl, methyl wherein one or more hydrogen is replaced by fluorine, ethyl wherein one or more hydrogen is replaced by fluorine, and $-(Sp)_a-X^1-*$ as defined above, provided that at least one of $R^{11}$ and $R^{16}$ is $-(Sp)_a-X^1-*$, and provided that if $X^{13}$ is $N-R^{15}$, then $R^{11}$ and $R^{16}$ are not both $-(Sp)_a-X^1-*$;
$R^{12}$, $R^{13}$, $R^{14}$, $R^{15}$ and $R^{17}$ are independently of each other selected from the group consisting of H, F, methyl, ethyl, methyl wherein one or more hydrogen is replaced by fluorine, ethyl wherein one or more hydrogen is replaced by fluorine, and two or three neighboring groups of $R^{12}$, $R^{13}$, $R^{14}$, $R^{15}$ and $R^{17}$ may together form an aliphatic or aromatic ring system having a total of from 6 to 24 aromatic ring atoms;

$X^{21}$, $X^{22}$ and $X^{23}$ are independently of each other selected from —N(H)—, —N=, =N—, —C($R^{23}$)=, =C($R^{23}$)— and —S—, wherein at least one of $X^{21}$, $X^{22}$ and $X^{23}$ is different from —C($R^{23}$)= and =C($R^{23}$)—;

$R^{21}$ and $R^{22}$ are independently of each other F, Cl, or straight-chain or branched alkyl with 1 to 15 C atoms, in which one or more non-adjacent C atoms are optionally replaced by —O—, —S—, —NR$^§$—, —CO—, —COO—, —O—CO—, —O—CO—O—, —CR$^§$=CR$^{§§}$— or —C≡C— and in which one or more H atoms are optionally replaced by F, Cl, Br, I or CN, or denote aryl, heteroaryl, aryloxy, heteroaryloxy, arylcarbonyl, heteroarylcarbonyl, arylcarbonyloxy, heteroarylcarbonyloxy, aryloxycarbonyl or heteroaryloxycarbonyl having 2 to 30 C atoms that is unsubstituted or substituted by one or more non-aromatic groups $R^{24}$, or $R^{21}$ and $R^{22}$, together with each other and with the 5-membered heterocycle to which they are attached, form an aromatic or heteroaromatic ring that comprises 5 to 7 ring atoms and is unsubstituted or substituted by 1, 2, 3, 4 or 5 groups $R^{24}$;

$R^{23}$ is on each occurrence identically or differently H, SH, NH$_2$, or straight-chain or branched alkyl with 1 to 15 C atoms, in which one or more non-adjacent C atoms are optionally replaced by —O—, —S—, —NR$^§$—, —CO—, —CO—O—, —O—CO—, —O—CO—O—, —CR$^§$=CR$^{§§}$— or —C≡— and in which one or more H atoms are optionally replaced by F, Cl, Br, I or CN;

$R^{24}$ is on each occurrence identically or differently H, halogen, —CN, —NC, —NCO, —NCS, —OCN, —SCN, —C(=O)NR$^§$R$^{§§}$, —C(=O)X$^0$, —C(=O)R$^§$, —NH$_2$, —NR$^§$R$^{§§}$, —SH, —SR$^§$, —SO$_3$H, —SO$_2$R$^§$, —OH, —NO$_2$, —CF$_3$, —SF$_5$, optionally substituted silyl, carbyl or hydrocarbyl with 1 to 40 C atoms that is optionally substituted and optionally comprises one or more hetero atoms;

$R^§$ and $R^{§§}$ are independently of each other H or optionally substituted carbyl or hydrocarbyl optionally comprising one or more hetero atoms; and $X^0$ is halogen, wherein said third electrode layer covers said second electrode layer through direct physical contact wherein no more than 20% of a surface of said second electrode layer is in direct physical contact with said organic semiconducting layer.

7. Organic electronic device according to claim 1, said organic electronic device being selected from the group consisting of organic field effect transistors (OFET), organic thin film transistors (OTFT), organic light emitting diodes (OLED), organic light emitting transistors (OLET), organic photovoltaic devices (OPV), organic photodetectors (OPD), organic solar cells, laser diodes, Schottky diodes, photoconductors and photodetectors.

8. Organic electronic device according to claim 1, said organic electronic device being an organic field effect transistor (PFET) or an organic thin film transistor (OTFT).

9. Method of producing the organic electronic device of claim 1, said method comprising the steps of
(a) providing one or more first electrode layer as defined in claim 1, optionally on a substrate as defined herein;
(b) depositing onto said first electrode layer a second electrode layer as defined in claim 1, to obtain one or more electrode; and
(c) depositing onto said electrode an organic semiconducting material to obtain an organic semiconducting layer.

10. Method according to claim 9, said method comprising the additional step of
depositing onto said second electrode layer a third electrode layer, said third electrode layer being a self-assembled monolayer, to obtain one or more electrode.

11. Method according to claim 9, wherein step (b) is performed by contacting the first electrode layer in a bath with ions of the second metal, wherein the second metal is suitable for electroless plating onto said first electrode layer.

12. Method according to any claim 9, wherein the second metal is selected from the group consisting of silver, metals having a work function D of at least 4.9 eV, and any blend of any of these.

13. Method according to claim 9, wherein the second metal is selected from the group consisting of silver, cobalt, rhodium, iridium, nickel, palladium, platinum, gold, and any blend of any of these; preferably is selected from the group consisting of silver, cobalt, iridium, nickel, palladium, platinum, gold, and any blend of any of these; more preferably is selected from the group consisting of silver, iridium, nickel, palladium, platinum, gold, and any blend of any of these; even more preferably is selected from the group consisting of silver, palladium, platinum, gold, and any blend comprising such metal.

14. Method according to claim 9, wherein step (b) is performed by contacting the first electrode layer in a bath with ions of the second metal, wherein the second metal is silver.

15. Method according to claim 10, wherein in step (b') a compound comprising at each occurrence independently any moiety selected from the group consisting of formulae (I), (II), and (Ill) is applied to the second electrode layer.

* * * * *